(12) United States Patent
Herman et al.

(10) Patent No.: US 8,160,841 B2
(45) Date of Patent: Apr. 17, 2012

(54) BRIDGE INFORMATION MODELING

(75) Inventors: Glen A. Herman, Olathe, KS (US);
Brian W. Trotta, Lenexa, KS (US);
James C. Peterson, Menomonee Falls, WI (US)

(73) Assignee: HNTB Holdings Ltd, Kansas City, MO (US)

( * ) Notice: Subject to any disclaimer, the term of this patent is extended or adjusted under 35 U.S.C. 154(b) by 798 days.

(21) Appl. No.: 12/055,961

(22) Filed: Mar. 26, 2008

(65) Prior Publication Data
US 2008/0243445 A1    Oct. 2, 2008

Related U.S. Application Data

(60) Provisional application No. 60/908,131, filed on Mar. 26, 2007.

(51) Int. Cl.
*G06F 17/50* (2006.01)
(52) U.S. Cl. .............. 703/1; 702/1; 702/5; 345/419; 345/420; 703/6
(58) Field of Classification Search ............ 703/1, 6; 700/97; 707/600, 661, 705, 736, 776, 791, 707/797, 829; 702/1, 5; 345/419, 420
See application file for complete search history.

(56) References Cited

U.S. PATENT DOCUMENTS

| | | | |
|---|---|---|---|
| 6,063,126 A | | 5/2000 | Borduin |
| 6,124,857 A * | | 9/2000 | Itoh et al. .................. 345/423 |
| 6,167,393 A | | 12/2000 | Davis |
| 6,578,189 B2 * | | 6/2003 | Hariya et al. ............... 716/55 |
| 6,684,222 B1 * | | 1/2004 | Cornelius et al. ................ 1/1 |
| 7,099,803 B1 * | | 8/2006 | Rappoport et al. ............ 703/1 |
| 7,295,958 B1 * | | 11/2007 | Suh et al. ..................... 703/7 |
| 7,324,102 B2 * | | 1/2008 | Inzinga et al. ............... 345/419 |
| 7,427,994 B2 * | | 9/2008 | Gangnet et al. .............. 345/606 |
| 7,516,157 B2 * | | 4/2009 | Cameron et al. ................ 1/1 |
| 7,577,681 B1 * | | 8/2009 | Rozenman et al. .............. 1/1 |
| 7,847,807 B2 * | | 12/2010 | Stehle et al. .................. 345/619 |
| 2002/0107673 A1 * | | 8/2002 | Haller et al. .................... 703/1 |
| 2002/0144231 A1 * | | 10/2002 | Hariya et al. .................. 716/20 |
| 2004/0225670 A1 * | | 11/2004 | Cameron et al. .............. 707/101 |
| 2005/0044113 A1 * | | 2/2005 | Manikutty et al. .......... 707/104.1 |
| 2005/0071135 A1 | | 3/2005 | Vredenburgh |
| 2006/0082571 A1 * | | 4/2006 | McDaniel ..................... 345/419 |
| 2008/0004737 A1 * | | 1/2008 | Bennardo ...................... 700/97 |

(Continued)

OTHER PUBLICATIONS

M. R. Halfawy, F. C. Hadipriono, J. Duane, R. Larew, "Development of model based systems for integrated design of highway bridges" International Conference on Civil, Structural and Environmental Engineering Computing, Rome, Italy, Aug. 30-Sep. 2, 2005, pp. 1-15.*

(Continued)

*Primary Examiner* — Kamini S Shah
*Assistant Examiner* — Kibrom Gebresilassie
(74) *Attorney, Agent, or Firm* — Shook, Hardy & Bacon L.L.P.

(57) ABSTRACT

Systems, methods, and computer-storage media are provided that allow data from different sources and aspects of bridge design and construction to be merged into a common bridge information model. The bridge information model may include geometric, structural, survey, and construction information associated with a bridge-development project. The bridge information model may be stored as data objects in a relational data structure. Each data object may represent a bridge structure element and include metadata and attributes describing the bridge structure element.

18 Claims, 25 Drawing Sheets

U.S. PATENT DOCUMENTS

2008/0126307 A1* 5/2008 Lin et al. .................. 707/3
2009/0300062 A1* 12/2009 Joguet et al. ............. 707/103 R
2010/0070241 A1* 3/2010 Opdahl et al. ................ 703/1

OTHER PUBLICATIONS

S. S. Chen, A. M. Shirole', "Integration of Information and Automation Technologies in Bridge Engineering and Management: Extending State of the Art", May 11, 2006, 25 pages.*

M. R. Halfawy, F. C. Hadipriono, J. Duane, R. Larew, "Development of model based systems for integrated design of highway bridges" 2005, pp. 1-15.*

S. S. Chen, A. M. Shirole', "Integration of Information and Automation Technologies in Bridge Engineering and Management: Extending State of the Art", 2006.*

M.R. Halfawy, F. C. Hadipriono, J. Duane, R. Larew, "Development of model based system for integrated design of highway bridges" p. 1-15, Aug. 30-Sep. 2, 2005.*

Stuart S. Chen, Integration of Information and Automation Technologies in Bridge Engineering and Management: Extending State of the Art, May 11, 2006, 25 pages.

Bridge Information Modeling (BrIM), http://www.bentley.com/en-US/Markets/Civil/Bridge+Information+Modeling/Overview.htm?print=true, Mar. 26, 2008, 2 pages.

PCT International Search Report and Written Opinion, Jun. 30, 2008.

* cited by examiner

BRIDGE INFORMATION MODELING

CROSS-REFERENCE TO RELATED APPLICATIONS

This application claims the benefit of U.S. Provisional Application No. 60/908,131, filed Mar. 26, 2007, which is incorporated herein in its entirety.

BACKGROUND

In today's civil engineering marketplace, every successful company can be measured by how well it converts information into dollars. Whether readily realized or not, civil engineering can be classified as a distinct segment of the information industry. Civil engineering consulting companies specialize in the collection and processing of information to create plans. These plans, whether on paper or in electronic format, represent the culmination of technical specialist's expertise and decision-making capabilities to process information to create a conceptual product. This conceptual product can then be used to construct the structures seen day to day in our world.

During the last 40 years, the civil engineering industry has witnessed radical changes as different aspects of the design process have been computerized and automated. Today, an enormous amount of information is provided and generated during the creation of plans. As new technology and computing power have become available, the requirements for additional information and processing have increased as well. Over this time span, different aspects of the design process have modernized at different rates. Structural analysis and design programs were the first to be computerized. Drafting processes were modernized by computers nearly a decade later. Only now are more sophisticated approaches to collaborating and delivering civil engineering products being developed. This disparity in modernization has led to a departmentalized design team where little information is in a form that can be shared easily between the engineer, draftsperson, surveyor, and constructor. Often, the same information is created multiple times for each perspective within the design team. This information must be checked separately for each group's perspective and, therefore, runs the risk of error introduction during data transposition.

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

Embodiments of the present invention relate to systems, methods, and computer-storage media for providing a bridge information model that merges information associated with bridge design and construction from several aspects and sources. The bridge information model allows users to access and view information associated with a bridge-development project from different perspectives, such as, for instance, from a geometric perspective, a structural perspective, a survey perspective, or a construction perspective.

Accordingly, in one aspect, an embodiment of the present invention is directed to a bridge information modeling system including one or more computing devices. The system includes a storage component storing bridge information as a plurality of data objects. Each data object represents an element of a bridge structure and includes data describing the element. Additionally, the data describing the element includes metadata and attributes that describe the element. The system also includes a data exchange that facilitates providing at least a portion of the bridge information in the storage component incident to receiving a request for the bridge information.

In another embodiment of the invention, an aspect is directed to one or more computer-storage media comprising computer-useable instructions for performing a method. The method includes populating a data storage component with bridge information including geographic-location information, origin information, and design-specification information associated with a bridge-development project. The method also includes receiving a request to access information from the data storage component. The method further includes determining a perspective of use associated with the request. The method also includes retrieving a portion of the bridge information from the data storage component based on the perspective of use associated with the request. The method still further includes communicating the portion of the bridge information for presentation.

A further aspect of the invention includes an embodiment directed to one or more computer-storage media comprising computer-useable instructions for performing a method. The method includes storing bridge information as a plurality of data objects, wherein each data object represents an element of a bridge structure and includes data describing the element, and wherein the data describing the element includes metadata and attributes that describe the element. The method also includes identifying two or more data objects having a sibling relationship, wherein each of the two or more data objects represent bridge structure elements of a given type. The method further includes defining at least one attribute of the bridge structure elements represented by the two or more data objects as a shared attribute, wherein any changes to the shared attribute are made to each of the two or more data objects.

BRIEF DESCRIPTION OF THE DRAWINGS

The present invention is described in detail below with reference to the attached drawing figures, wherein.

DETAILED DESCRIPTION

The subject matter of the present invention is described with specificity herein to meet statutory requirements. However, the description itself is not intended to limit the scope of this patent. Rather, the inventors have contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

Overview

Embodiments of the present invention provide, among other things, a merging of information relating to bridge design and construction from several aspects that allows for greater efficiency and reduces risk. This allows knowledge to be more effectively leveraged to create the best possible product. Embodiments include a bridge information model that organizes bridge information and encompasses several aspects of use for bridge design and minimizes or eliminates data transposition. Embodiments also include processes that leverage the bridge information model information to effectively analyze, design, and create plans.

The bridge information model may act as a container of spatially-referenced data from several different sources. The information stored in the bridge information model may be designed and implemented based on several identified perspectives of use. These perspectives include the owner, contractor, engineer, surveyor, draftsperson or any other "actor" that would use this information in the bridge information model process. Each perspective may leverage the information provided by other perspectives as well as contribute their own information.

In accordance with some embodiments of the present invention, the bridge information model is a relational database that acts as a container for bridge-related data. The bridge information model is stored in a structured documented hierarchal format that makes it possible to mine data from its stored feature data sets. The type of information available may vary from basic metadata (geographic location, origin, classification, design specifications, etc.) down to the reference attributes of specific bridge components (material types, manufacturer, specifications, etc.). Bridge information models could be stored in larger aggregate collections or extracted into sub-models for further processing. There are numerous possibilities for data mining a bridge information model. For instance, because of its structured format, analysis could be performed to locate use of specific components or identify critical inspection details and assist in scheduling maintenance based on geographic criteria.

Figure 2:
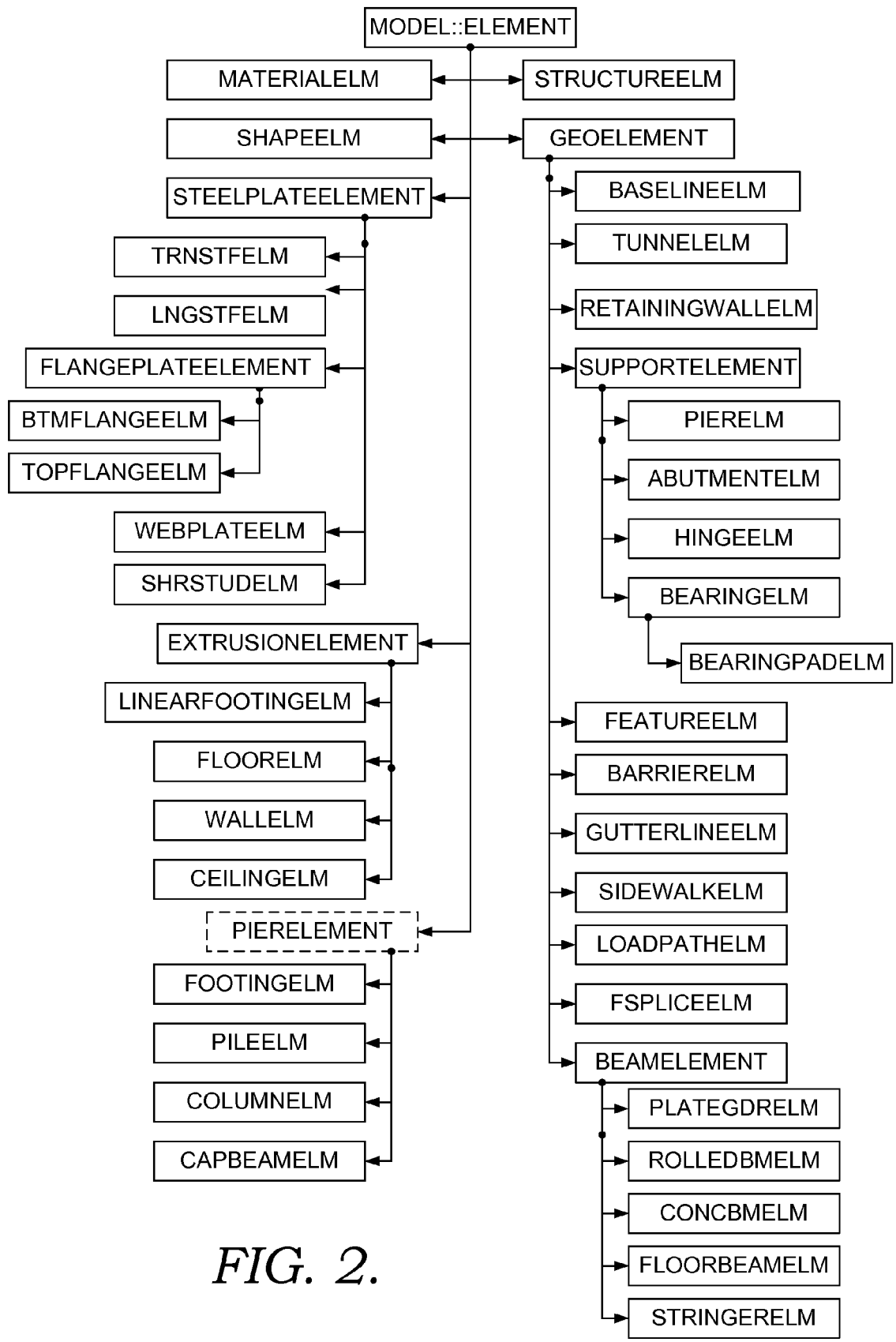
FIG. 2 is a block diagram showing hierarchical relationships among elements of a bridge structure in a bridge information model in accordance with an embodiment of the present invention.

Each of the elements of the bridge structure are defined in a relational way such that there are dependencies with other elements. The relationships include both parent/child and sibling relationships between elements. For instance, FIG. 2 provides a block diagram illustrating parent/child relationships between elements of a bridge structure. Each element shown in FIG. 2 represents a data object that includes information describing attributes of a component or subcomponent of a bridge structure. The links between elements of FIG. 2 illustrate the parent/child relationships among the various elements.

Figure 3:
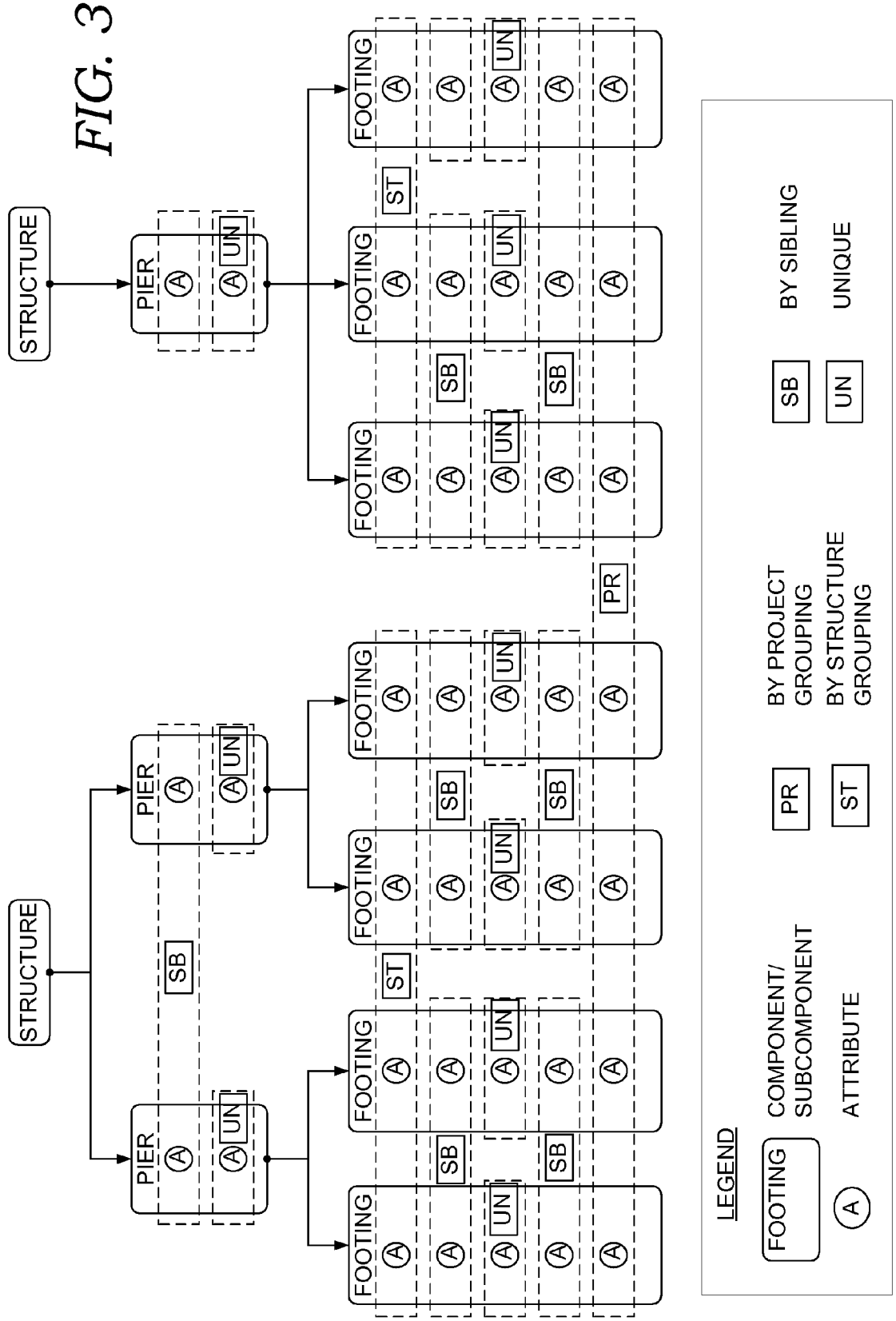
FIG. 3 is a block diagram showing sibling relationships among elements of a bridge structure in a bridge information model in accordance with an embodiment of the present invention.

Turning to FIG. 3, a block diagram is provided to demonstrate sibling relationships between components and subcomponents of a bridge structure. In particular, FIG. 3 provides an example of a project that includes two structures (e.g., two different bridges) and pier components and footing subcomponents for each of the structures. Each pier component and footing subcomponent of the bridge structures may include a number of attributes describing the component/subcomponent. Additionally, as depicted in FIG. 3, an attribute for a given component/subcomponent may be shared with one or more other components/subcomponents or may be unique. A shared attribute indicates that the components/subcomponents will each have the same value for that shared attribute.

When an attribute is shared among sibling components/subcomponents, the attribute may be shared: by project (e.g., all components/subcomponents of a given type in the project share the attribute); by structure (e.g., all components/subcomponents of a give type in a structure share the attribute); and by sibling (only some selected components/subcomponents share the attribute).

Allowing siblings to share attributes provides a powerful way for users to create and/or edit data for a bridge structure. Instead of requiring a user to enter information for each component/subcomponent, attributes may be defined once and shared when the component/subcomponents are created. Additionally, changes to a shared attribute may be made once by a user and be applied to all siblings sharing that attribute as opposed to requiring the user to change the attribute for each and every component/subcomponent.

Figure 4:
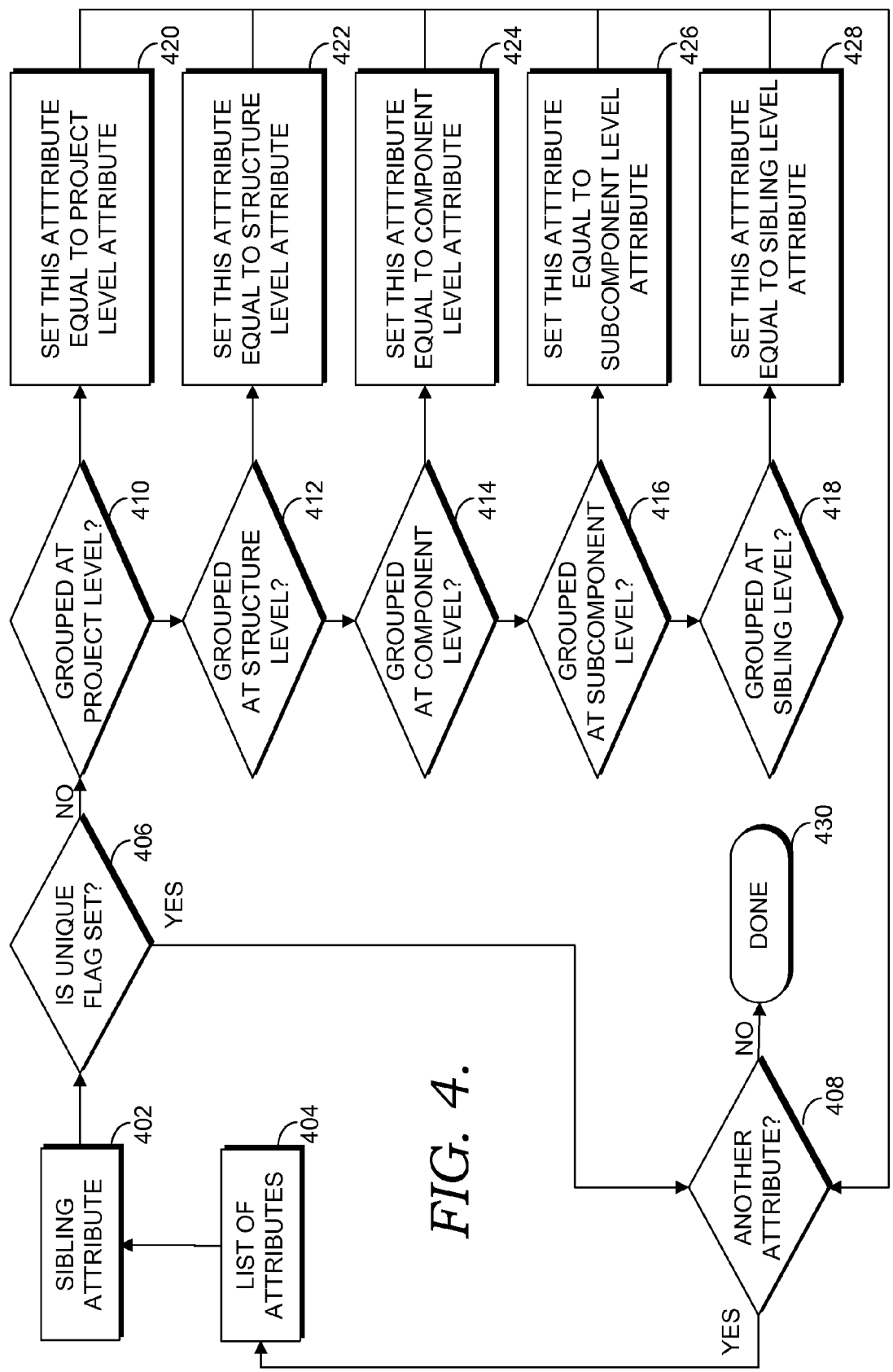
FIG. 4 is a flow diagram showing a method for defining sibling relationships in accordance with an embodiment of the present invention.

FIG. 4 provides a flow diagram of a method for defining sibling relationships for a component/subcomponent in accordance with an embodiment of the present invention. Given a list of attributes 402, a sibling attribute is identified at block 404. Whether the attribute has a unique flag set is determined at block 406. A unique flag indicates that the attribute is not shared with siblings. If the unique flag is set, another attribute may be selected as represented by block 408. If the unique flag is not set, a determination is made regarding whether the attribute is shared at the project level, at the structure level, at the component level, at the subcomponent level, or at a sibling level, as shown at block 410, 412, 414, 416, and 418. The attribute is then set based on the designation, as represented at blocks 420, 422, 424, 426, and 428. The process is repeated for each attribute in the list of attributes 402 until all attributes have been processed. The process then ends at block 430.

The bridge information model, in some embodiments, may include a collection of interrelated models. These models may include a geometric model, structural analysis and design model, physical model, and survey/construction model. As will be described in further detail below and appreciated by those skilled in the art, interdependencies exist between one type of model with respect to another. As an example, models are dependent on a geometric model for location and member size.

The geometric model provides a connection between highway layout and the bridge layout. The geometric model provides the backbone of the bridge information model since it represents the model's most basic attributes—spatial location. Components and perspectives are controlled by this model. A geometric model is comprised of elements that describe the horizontal and vertical layout of structural features within a bridge structure. For instance, girders can be represented as a chain of horizontal tangent, curved or spiral segments. Each segment of this chain is influenced by predefined vertical geometry to produce a final location in space. Usually the elements described are limited to reference lines that represent a collection of subcomponents. For instance, a girder reference line controls the location, placement, and dimensions of related child elements (flange plates, web plates, stiffeners, etc.) within the model.

Structural analysis requires a strict layout of components that contain a multitude of attributes to store physical properties, analysis and design results. The structural analysis and design model includes those components that affect analysis and design and may include assumptions made about physical characteristics of the structure. A bridge structural analysis model can be represented by a wide variety of detail and/or components. In the past, this model has been kept independent of geometric, physical or construction viewpoints. Sometimes the model is simplified based on the complexity of the structure being built. This is due, in part, to available computational power available to the engineer. More complex models require more time to create and require more computational power to process. The type and granularity of the model in embodiments is easily scaled to assist the user depending on the application of the data. For instance, bridge information model data could be transformed or scaled to create analysis input for line, grid, or finite element analysis by external tools.

The physical model is an accurate 3-dimensional geometric representation of structural components within a bridge structure. This model may include components with detail down to the smallest element of a bridge structure. In some cases, this detail will be sufficient to calculate volumetric quantities for estimating and construction. Models of this type could be transformed for use in 3D renderings, animations or virtual environments.

The survey/construction model would include, for instance, the data placed in plans from the geometric model and detail dimensions. Everything necessary to lay out and build the bridge structure is contained in the plans. Traditionally, this information was not collected together in an ordered logical format for use by the surveyor and construction technicians. From a transportation design/construction perspective, the civil engineering industry is being revolutionized by data transfer to survey instruments and construction equipment. The type and presentation of some types of data provided in highway plans is now becoming unnecessary. For instance, the large number of highway cross sections provided are becoming obsolete since grading machines can be programmed directly to shift their blade movement to follow a digital terrain model (DTM) through a programmable digital control devices.

Figure 5:
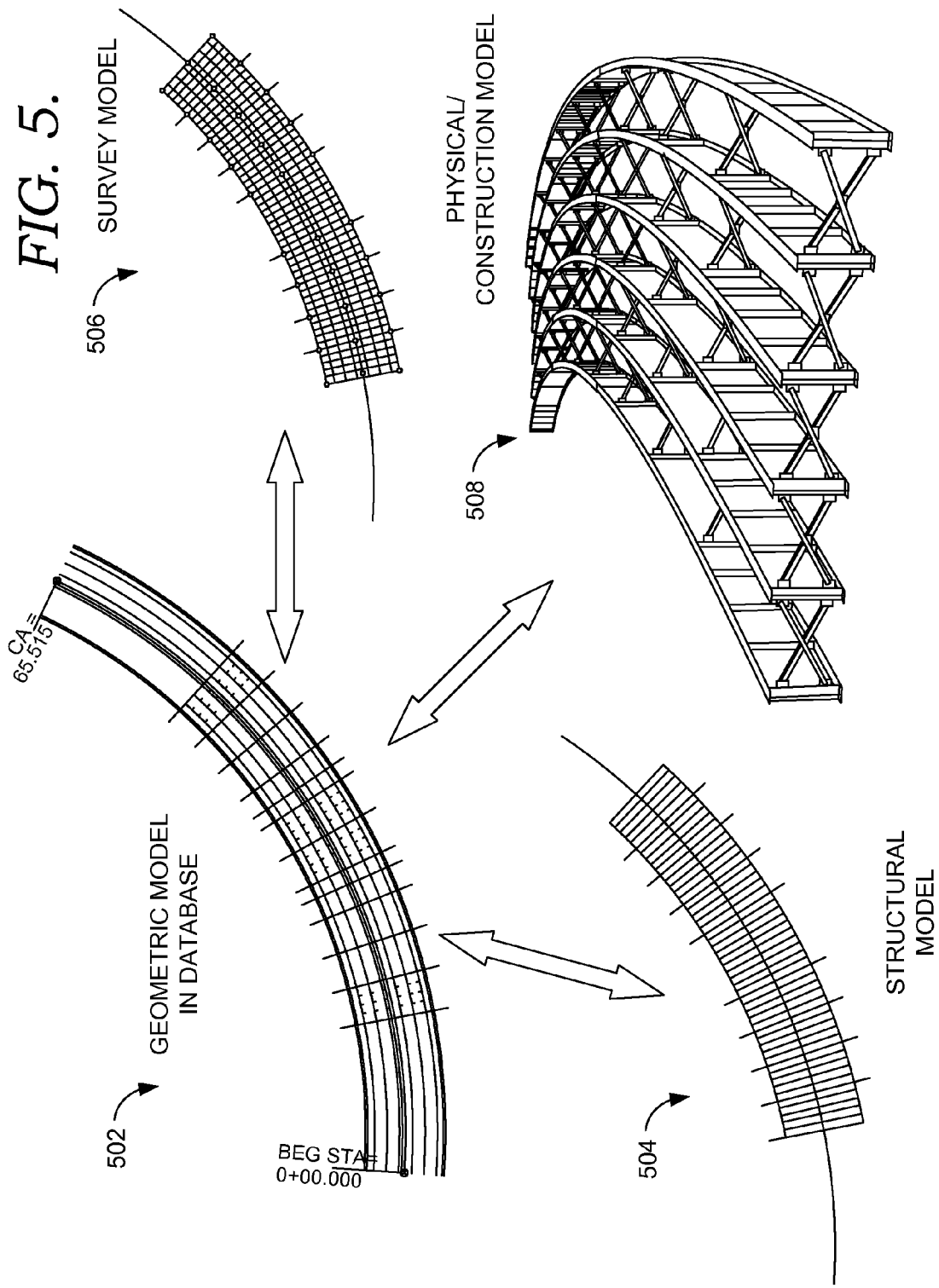
FIG. 5 is a graphical depiction of how data may be accessed from a bridge information model for a given structure and viewed based on different perspectives.

FIG. 5 provides a graphical example of how data may be accessed from the bridge information model for a given structure and viewed based on different perspectives. The example shown in FIG. 5 provides different views of a superstructure component of a bridge structure. The views include: a view 502 from a geometric model perspective; a view 504 from a structural model perspective, a view 506 from a survey model perspective; and a view 508 from a physical/construction model perspective. The view 502 from the geometric model perspective provides a geometric representation of the bridge information model for the structure. In particular, reference lines and other geometric information for the structure is provided.

The view 504 of the structural model perspective is based on the location of the different types of members and joints. The view 504 in the present example provides a meshed-type top-down view, in which each of the line segments represents a different type of structural member for structural analysis purposes. Each of the line segments may have attribute data relevant to the structural model perspective. For instance, the attribute data may indicate that a line represents a beam with a given width and thickness.

The view 506 for the survey model perspective provides information such as key points that a surveyor would use to lay out the bridge structure. For instance, a key point may be wherever a girder intersects a bearing line.

The view 508 of the physical/construction model perspective provides a 3D representation of the structure based on metadata and attributes associated with the superstructure subcomponent. In some embodiments, the 3D representation may be navigated to view different construction details. Additionally, portions of the structure may be "turned off" such that they are removed from the 3D representation so only a portion of the structure is presented in the 3D representation.

Exemplary Operating Environment

Figure 1:
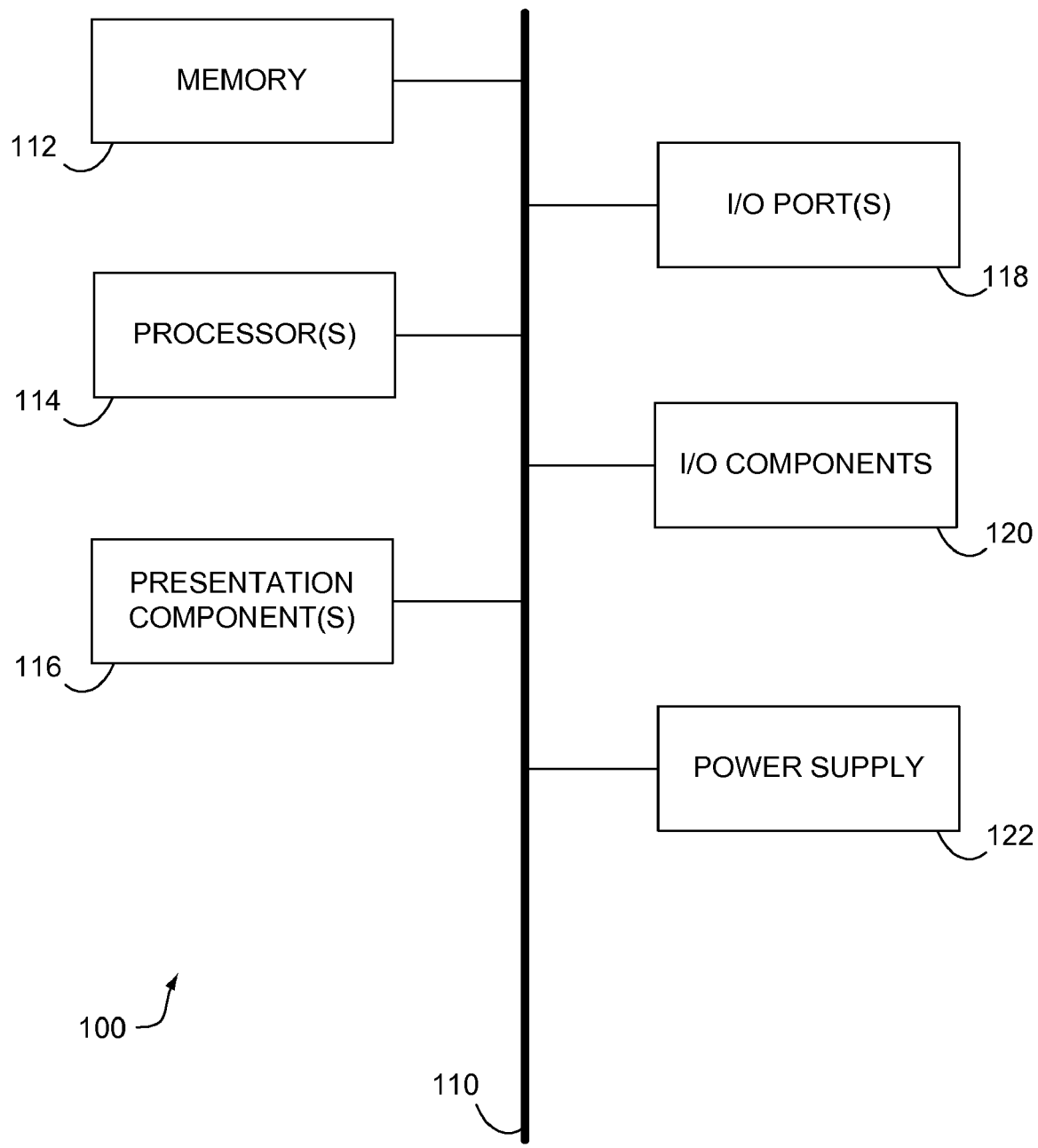
FIG. 1 is a block diagram of an exemplary computing environment suitable for use in implementing the present invention.

Having briefly described an overview of the present invention, an exemplary operating environment in which various aspects of the present invention may be implemented is described below in order to provide a general context for various aspects of the present invention. Referring initially to FIG. 1 in particular, an exemplary operating environment for implementing embodiments of the present invention is shown and designated generally as computing device 100. Computing device 100 is but one example of a suitable computing environment and is not intended to suggest any limitation as to the scope of use or functionality of the invention. Neither should the computing device 100 be interpreted as having any dependency or requirement relating to any one or combination of components illustrated.

The invention may be described in the general context of computer code or machine-useable instructions, including computer-executable instructions such as program modules, being executed by a computer or other machine, such as a personal data assistant or other handheld device. Generally, program modules including routines, programs, objects, components, data structures, etc., refer to code that perform particular tasks or implement particular abstract data types. The invention may be practiced in a variety of system configurations, including hand-held devices, consumer electronics, general-purpose computers, more specialty computing devices, etc. The invention may also be practiced in distributed computing environments where tasks are performed by remote-processing devices that are linked through a communications network.

With reference to FIG. 1, computing device 100 includes a bus 110 that directly or indirectly couples the following devices: memory 112, one or more processors 114, one or more presentation components 116, input/output ports 118, input/output components 120, and an illustrative power supply 122. Bus 110 represents what may be one or more busses (such as an address bus, data bus, or combination thereof). Although the various blocks of FIG. 1 are shown with lines for the sake of clarity, in reality, delineating various components is not so clear, and metaphorically, the lines would more accurately be grey and fuzzy. For example, one may consider a presentation component such as a display device to be an I/O component. Also, processors have memory. We recognize that such is the nature of the art, and reiterate that the diagram of FIG. 1 is merely illustrative of an exemplary computing device that can be used in connection with one or more embodiments of the present invention. Distinction is not made between such categories as "workstation," "server," "laptop," "hand-held device," etc., as all are contemplated within the scope of FIG. 1 and reference to "computing device."

Computing device 100 typically includes a variety of computer-readable media. Computer-readable media can be any available media that can be accessed by computing device 100 and includes both volatile and nonvolatile media, removable and non-removable media. By way of example, and not limitation, computer-readable media may comprise computer storage media and communication media. Computer storage media includes both volatile and nonvolatile, removable and non-removable media implemented in any method or technology for storage of information such as computer-readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by computing device 100. Communication media typically embodies computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer-readable media.

Memory 112 includes computer-storage media in the form of volatile and/or nonvolatile memory. The memory may be removable, nonremovable, or a combination thereof. Exemplary hardware devices include solid-state memory, hard drives, optical-disc drives, etc. Computing device 100 includes one or more processors that read data from various entities such as memory 112 or I/O components 120. Presentation component(s) 116 present data indications to a user or other device. Exemplary presentation components include a display device, speaker, printing component, vibrating component, etc.

I/O ports 118 allow computing device 100 to be logically coupled to other devices including I/O components 120, some of which may be built in. Illustrative components include a microphone, joystick, game pad, satellite dish, scanner, printer, wireless device, etc.

Overall Bridge Information Model System

Figure 6:
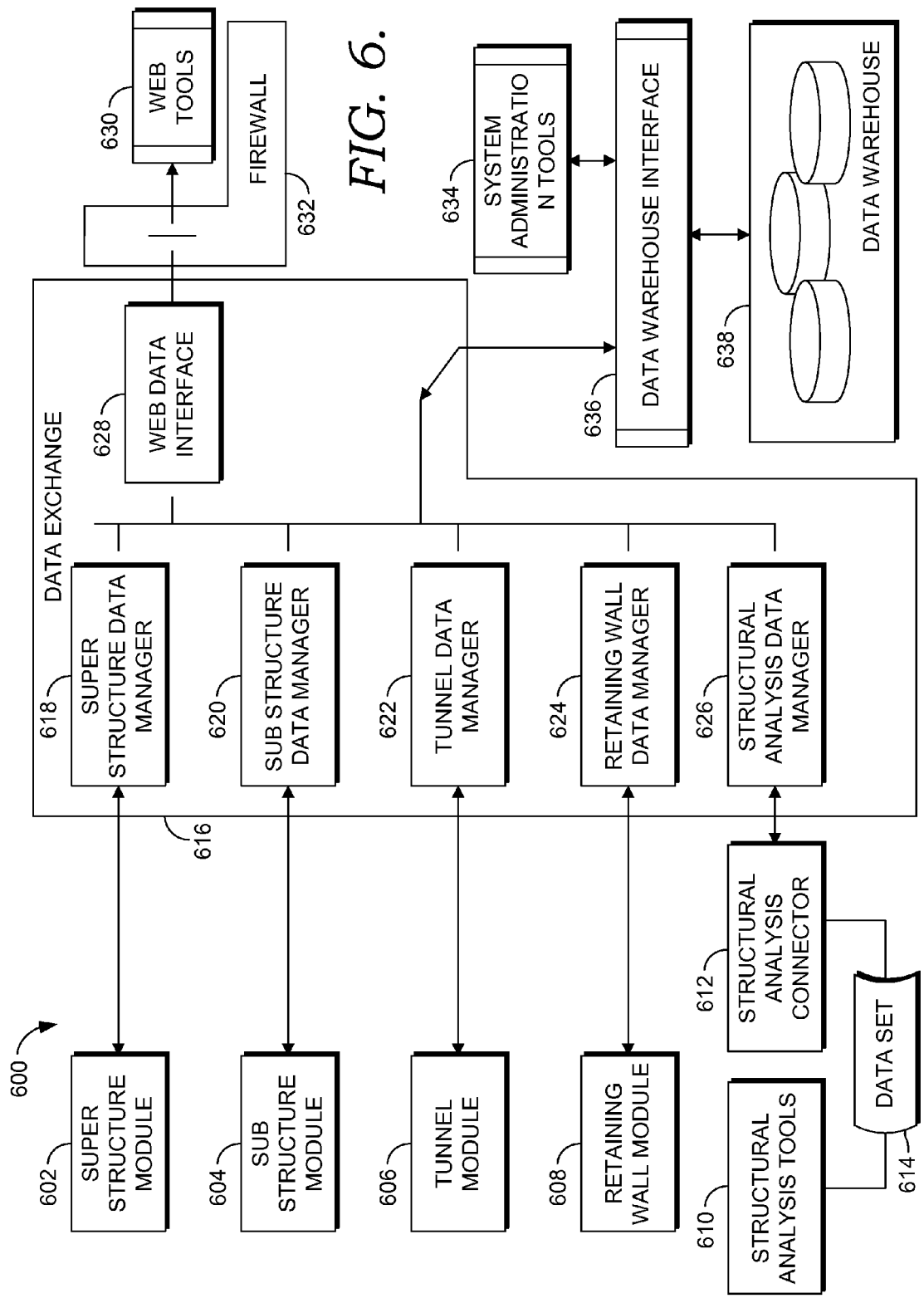
FIG. 6 is a block diagram of an exemplary bridge information model system in which embodiments of the present invention may be employed.

Referring now to FIG. 6, a block diagram is shown of an exemplary system 600 in which exemplary embodiments of the present invention may be employed. It should be understood that this and other arrangements described herein are set forth only as examples. Other arrangements and elements (e.g., machines, interfaces, functions, orders, and groupings of functions, etc.) can be used in addition to or instead of those shown, and some elements may be omitted altogether. Further, many of the elements described herein are functional entities that may be implemented as discrete or distributed components or in conjunction with other components, and in any suitable combination and location. Various functions described herein as being performed by one or more entities may be carried out by hardware, firmware, and/or software. For instance, various functions may be carried out by a processor executing instructions stored in memory.

The system 600 illustrates an overall bridge information model system in accordance with one embodiment of the present invention. As shown in FIG. 6, the bridge information model system 600 includes a data warehouse 638 for storing comprehensive data for bridge design, analysis, and construction. The data describes various aspects of a bridge structure in accordance with the bridge information model as described herein. The data warehouse 638 may be centrally located and accessible to multiple users using customized user interfaces.

A variety of different types of users may contribute data to and consume data from the data warehouse 638 for a given project. These users may include, for instance, owners, contractors, engineers, surveyors, and draftspersons. In an embodiment, each user would be able to edit and view data from the data warehouse based on privileges assigned to each user. For example, system administration tools 634 may be provided for defining security settings and user information, such as usernames and passwords that may be associated with user profiles. The user profiles define each user's access to the data warehouse 638 and the various data pieces. In addition, the user profiles may define each user's ability to enter and modify data. The system administration tools 634 allow administrators to define and modify those security settings and user privileges.

A data warehouse interface 636 is provided for accessing data from and providing data to the data warehouse 638. The data warehouse interface 636 is in communication with data exchange components 616, which operate to push and pull data to and from the data warehouse 638 via the data warehouse interface 636. The data exchange components 616 may communicate with other components of the bridge information model system 600 to coordinate access to appropriate data pieces stored by the data warehouse 638, as well as receiving data from these other components and communicating the data to the data warehouse 638 for storage. As shown in FIG. 6, the data exchange components 616 include a superstructure data manager 618 for interfacing with a superstructure module 602, a substructure data manager 620 for interfacing with a substructure module 604, a tunnel data manager 622 for interfacing with a tunnel module 606, and a retaining wall data manager 624 for interfacing with a wall module 608. Each of the modules 602, 604, 606, and 608 provide tools for defining elements of bridge structures, including superstructures, substructures, tunnels, and retaining walls, respectively. Some aspects of each of these modules will be described in further detail below. Accordingly, each of the modules act as sources of data for bridge structures stored by the data warehouse 638. Although not shown, other sources of data may be provided by the bridge information model system 600 in various embodiments of the present invention.

The data exchange components 616 also include a structural analysis data manager 626 that facilitates allowing structural analysis tools 610 to access data sets 614 from the data warehouse to perform structural analysis on bridge structures. The structural analysis connector 612 may facilitate the transformation of data between formats appropriate for the data warehouse 638 and the structural analysis tools 610.

A web data interface 628 is further provided to facilitate interacting with a variety of web tools 636. The web tools 636 allow users to access and view different pieces of data from the data warehouse 638 from remote locations over a network, such as the Internet. A secure login may be required for users to access data in the data warehouse 638, which may be located behind a firewall 632 for security purposes.

Common Processes for Interacting with the Bridge Information Model System

A number of common processes may be employed by users of the bridge information model system to create and edit projects, structures, and reference lines. These processes are described below with reference to FIG. 7 through FIG. 9.

Figure 7:
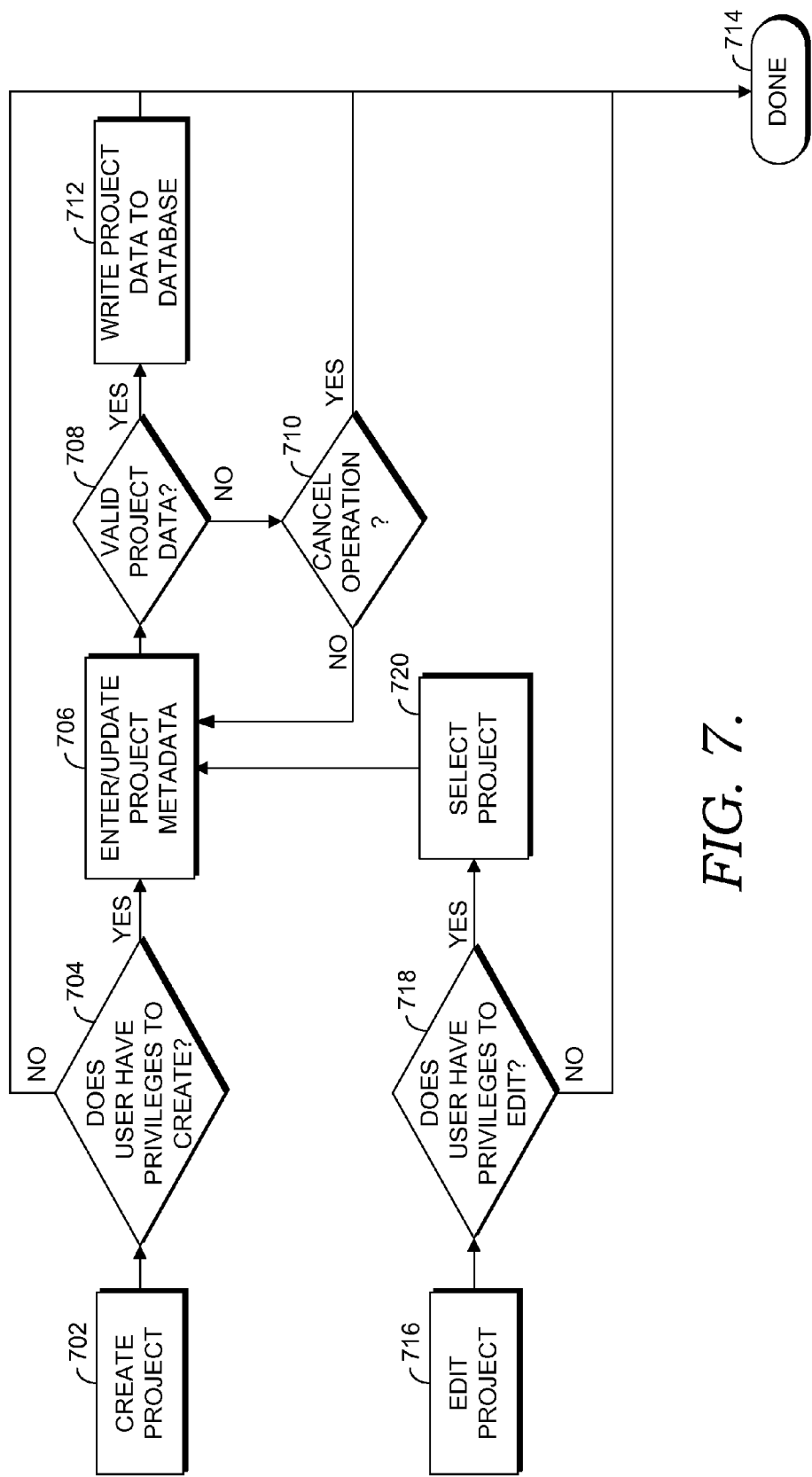
FIG. 7 is flow diagram showing a method for creating and/or editing a project in accordance with an embodiment of the present invention.

Referring initially to FIG. 7, a flow diagram is provided illustrating a method for creating and/or editing a project in accordance with an embodiment of the present invention. As used herein, the term "project" may include one or more bridge structures that are managed together. As shown at block 702, a user may initially select to create a new project in the bridge information model system. The system determines at block 704 whether the user has sufficient privileges to create a project. As indicated previously, each user of the bridge information model system may have different levels of privileges for accessing and providing data to the system. Accordingly, in some embodiments, the ability to create a project may be restricted to only certain users with a given privilege level. For instance, one or more users may be defined as a project administrator, and only those users would be allowed to create a project.

If the user does not have significant privileges to create a project, the user is prevented from continuing and the process ends at block 714. The system may also present an error message or other message indicating to the user that the user does not have sufficient privileges to create a project. Alternatively, if the user does have privileges to create a project, processing continues at block 706. The user may enter project metadata for the project. The project metadata may include, for instance, a name of the project, project description, identification of personnel for a project (e.g., acting project manager and technical manager), contact information for personnel, and status information. The project metadata may be used for a variety of purposes, including, for instance, generally describing the project, sorting purposes, and reporting purposes. Whether the entered project data is valid is determined at block 708. For instance, when a project name is entered, the name may be determined to be invalid as it is a duplicate name. If the project data that was entered is not valid, the user may determine at block 710 to either enter new project data or to cancel operation. If the project data is determined to be valid at block 708, the project data is written to the bridge information model data store, as shown at block 712. The process then ends at block 714.

A user may also edit a project after it has been created. For instance, as shown at block 716, a user may select to edit a project. A determination is made regarding whether the user has sufficient privileges to edit the project at block 718. In some embodiments, users who can edit a project may be limited to those users who may create a project. In other embodiments, other users may be given privileges to edit a project. If the user has sufficient privileges, the user may select a particular project at block 720. The process of entering/updating and storing project data then proceeds at blocks 706, 708, 710, and 712.

Figure 8:
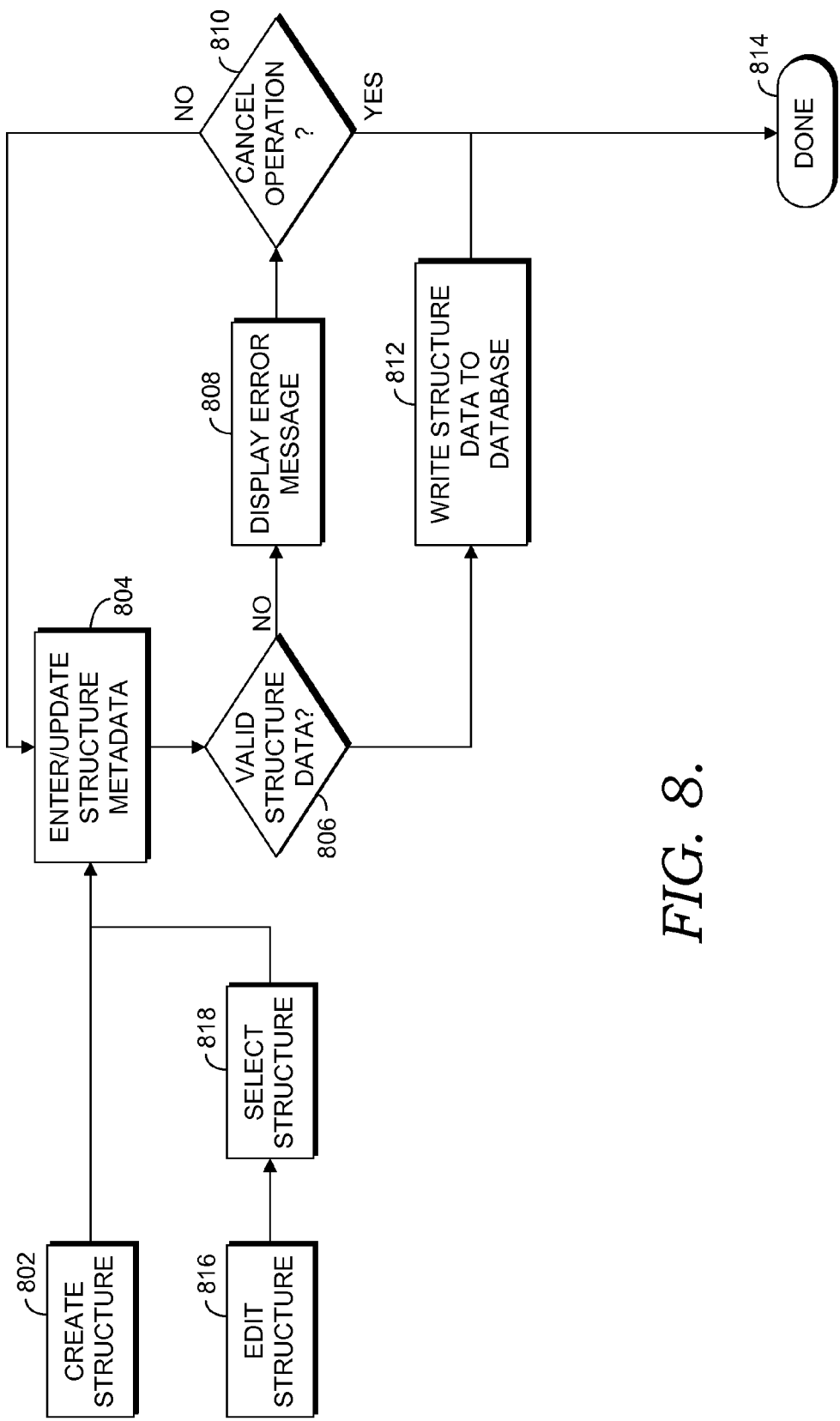
FIG. 8 is flow diagram showing a method for creating and/or editing a structure in accordance with an embodiment of the present invention.
Figure 9:
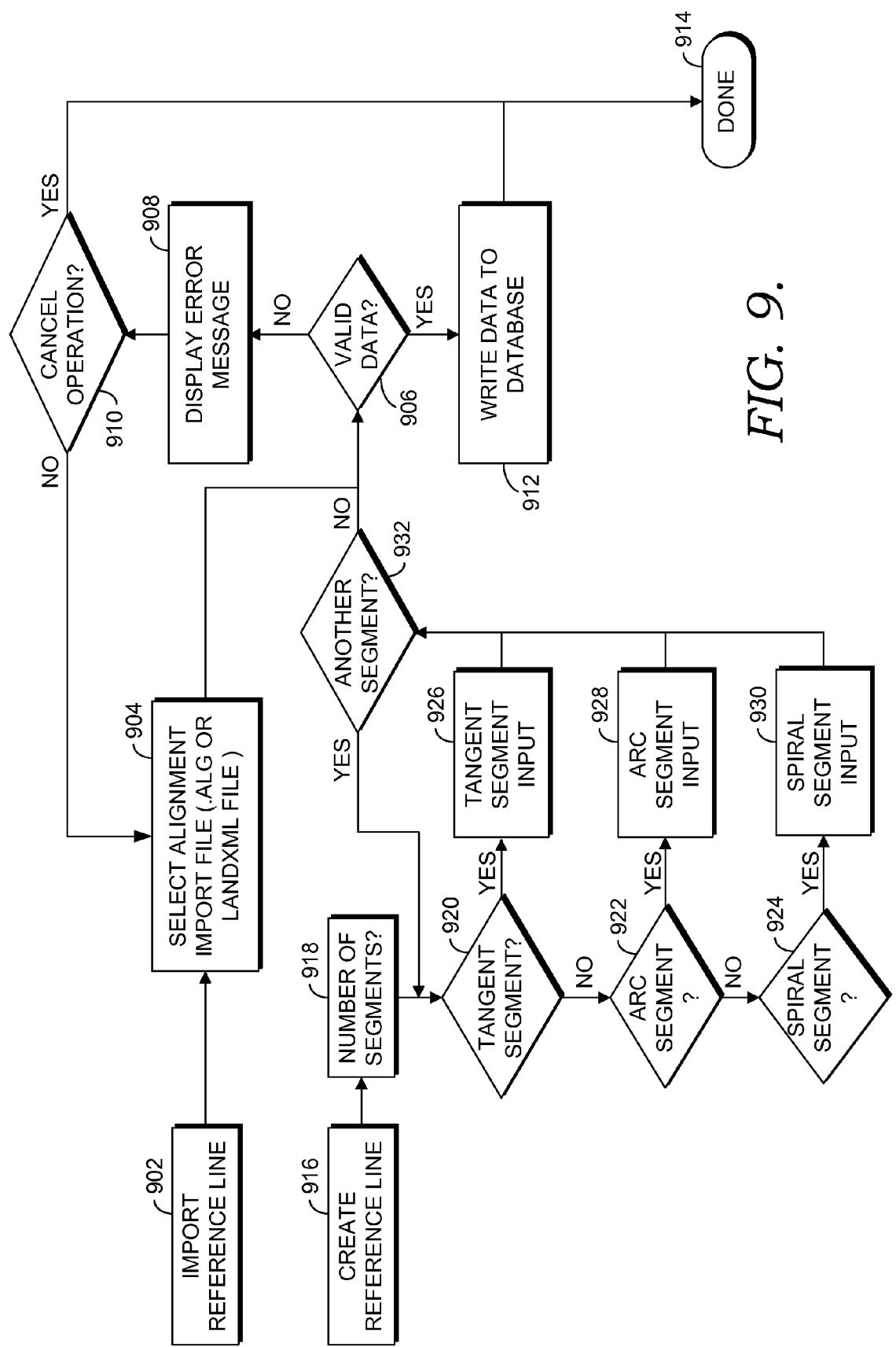
FIG. 9 is flow diagram showing a method for importing and/or creating a reference line in accordance with an embodiment of the present invention.

After a project has been created, one or more bridge structures may be created and/or edited for the project. Turning to FIG. 8, a flow diagram is provided showing a method for creating and/or editing a structure for a project in accordance with an embodiment of the present invention. As used herein, the term "structure" refers to a collection of components and subcomponents that together form a bridge or other civil engineering structure. Initially, as shown at block 802, a user may select to create a structure. Although not shown in FIG. 8, in some embodiments, only users with sufficient privileges may be able to create a structure. At block 804, the user enters metadata for the structure. By way of example only and not limitation, the structure metadata may include a name of the structure and a structure description.

After a user has entered structure metadata, a determination is made regarding whether the entered structure metadata is valid, as shown at block 806. If the structure metadata is not valid, an error message may be displayed at block 808, and the user may select to either cancel operation or to reenter structure metadata, as shown at block 810. If the entered structure metadata is valid, the data is written to the bridge information model data store, as shown at block 812. Processing then ends at block 814.

FIG. 8 also illustrates that a user may select an existing structure to edit. At block 816, a command is received to edit a structure. An existing structure is specified at block 818. The process of blocks 804, 806, 808, 810, and 812 as described above is then performed.

Reference lines may be used in embodiments to lay out components of structures within the bridge information model system. Accordingly, referring now to FIG. 9, a flow diagram is illustrated showing a method for importing and/or creating a reference line for a structure in accordance with an embodiment of the present invention. In some instances, reference lines for structures may be imported from external data sources, for instance, in basic transportation design data. As shown at block 902, a user may select to import a reference line. Reference lines may be imported from a variety of different sources, including, for instance, a road alignment file or a LandXML file, which is a generic open standard format that most transportation design packages create. At block 904, the user selects an alignment import file for importing a reference line. Whether reference line data from the import file is valid is determined at block 906. If the data is not valid, an error message is displayed at block 908, and the user may chose whether to select another import file or to cancel operation, as shown at block 910. If the data is valid, the data is written to the bridge information model data store at block 912. Processing then ends at block 914.

In some cases, external data for a reference line may not be available for importing the data to the system. In such instances, a user may select to create a reference line, as shown at block 916. The system may prompt the user to indicate a number of segments for the reference line, as shown at block 918. After indicating the number of segments for the reference line, the user may select a type of segment to create. For instance, as shown at block 920, 922, and 924, the user may create a tangent segment, an arc segment, or a spiral segment. Depending on the type of segment selected, the user may enter data for the segment at blocks 926, 928, and 930 as tangent segment input, arc segment input, or spiral segment input. After data is input for a segment, whether there is another segment for the reference line is determined at block 932. If there is another segment, the process of blocks 920 through 930 is repeated. When information for all segments of the reference line have been input, the process of blocks 906 through 912 such as that described above is performed to validate the data and write the data to the bridge information model data store.

Superstructure Module

Figure 10:
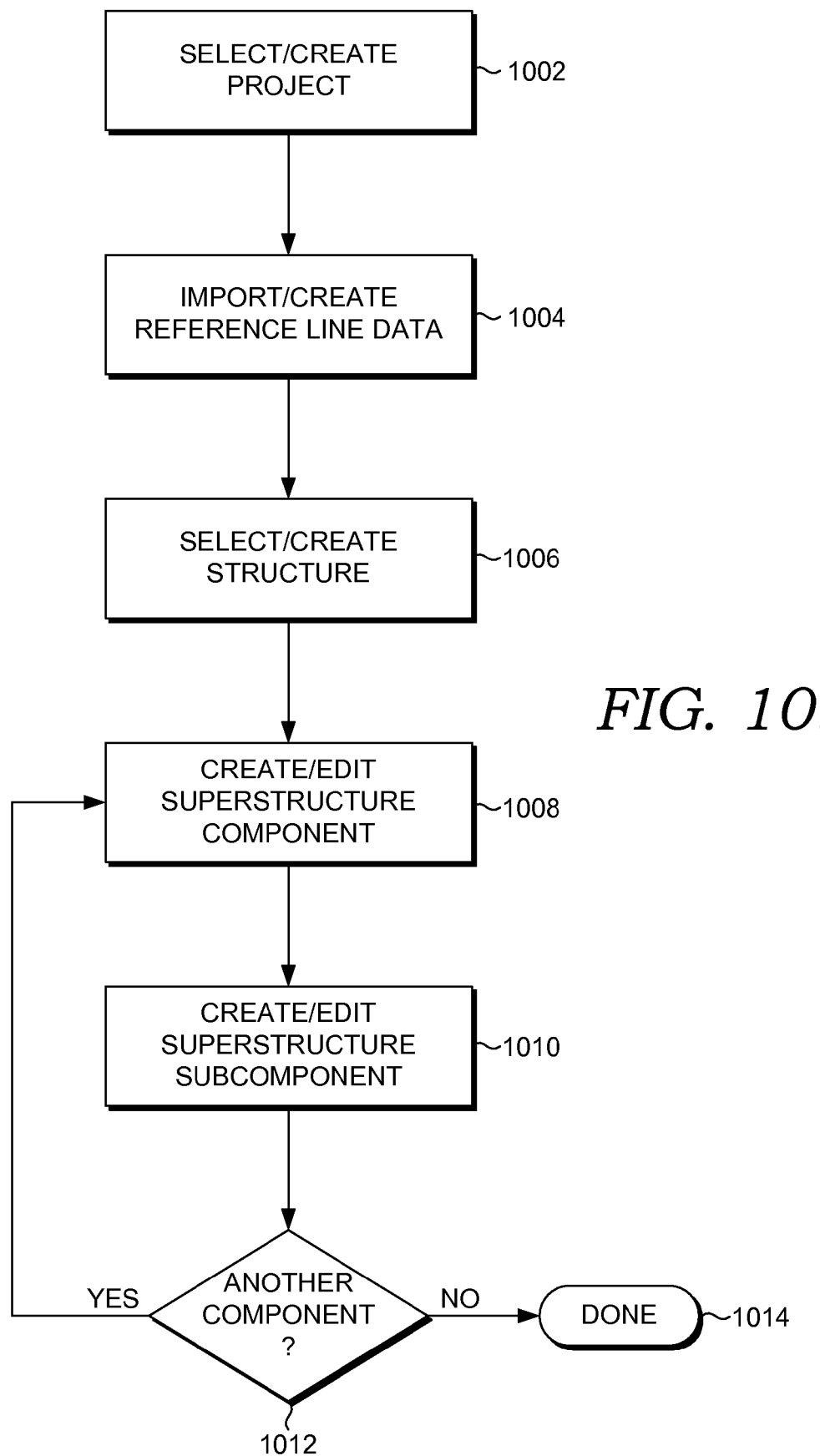
FIG. 10 is flow diagram showing an overall method for creating and/or editing a superstructure component in accordance with an embodiment of the present invention.

The superstructure module may be employed for creating and/or editing superstructure components for a bridge structure. Turning initially to FIG. 10, a flow diagram is provided illustrating an overall method for creating and/or editing information for a superstructure component in accordance with an embodiment of the present invention. As shown in FIG. 10, the process begins when a project is selected at block 1002. Alternatively, if a given project has not already been created, the user may create a new project, as described above with reference to FIG. 7. Reference line data is then imported or created, as shown at block 1004. Reference line data may be imported or created using a process similar to that described above with reference to FIG. 9. The user may then select an existing structure within the project or may create a new structure (e.g., using the process described above with reference to FIG. 8), as shown at block 1006.

As shown at block 1008, after selecting or creating a structure, a superstructure component for that structure may be created and/or edited. Although not shown in FIG. X, the process of creating/edit a superstructure component at block 1008 may include entering metadata for the superstructure component. The superstructure component metadata may include, for instance, a name and description for the superstructure component. The superstructure component and metadata are stored in the bridge information model data store.

Figure 11:
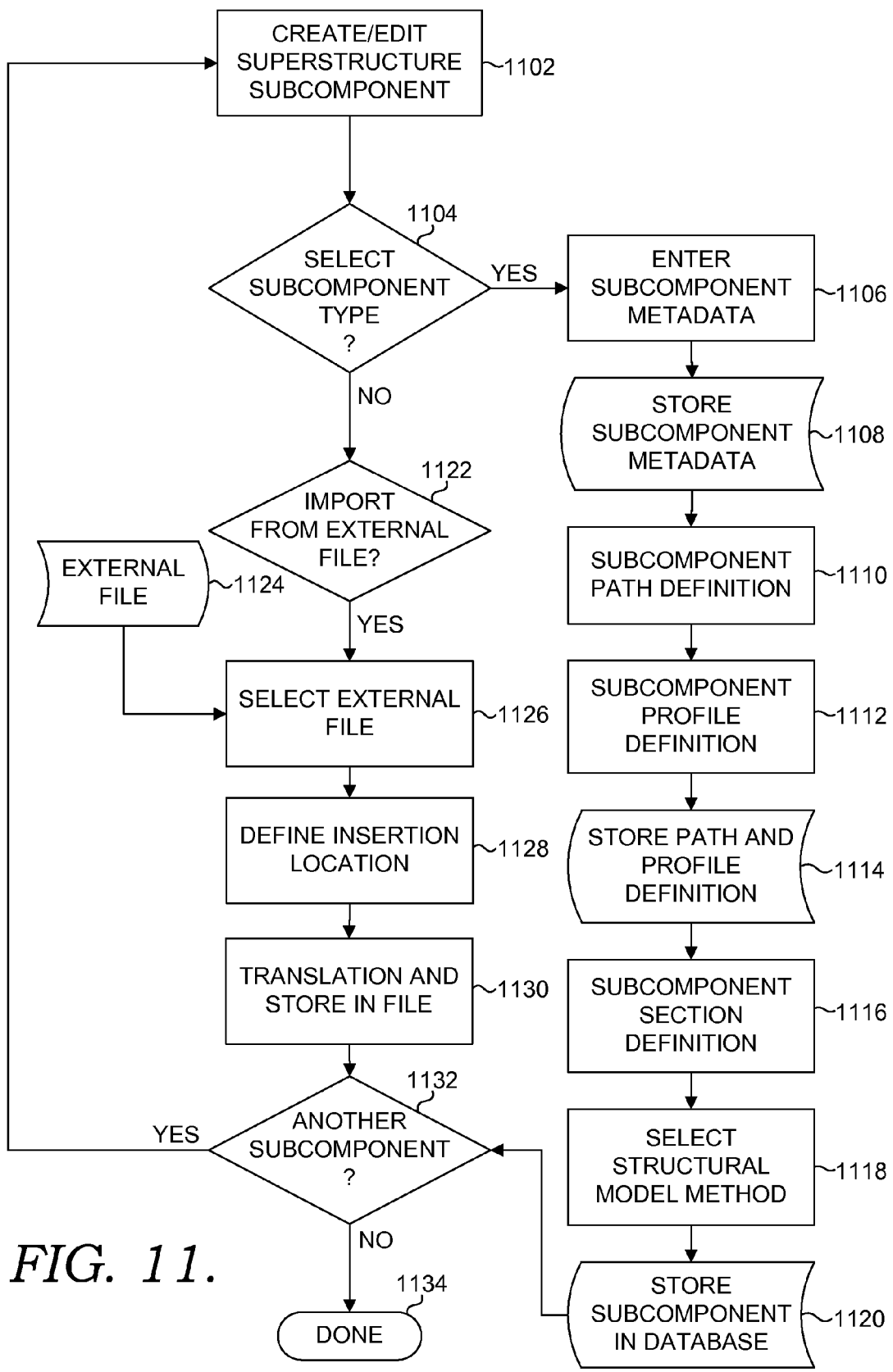
FIG. 11 is flow diagram showing a method for creating and/or editing a superstructure subcomponent in accordance with an embodiment of the present invention.

A superstructure component may include a number of subcomponents. Accordingly, superstructure subcomponents are created and/or edited at block 1010. A process for creating and/or editing a substructure component is illustrated in FIG. 11. As shown in FIG. 11, the process may begin by a user selecting to create or edit a superstructure component at block 1102. The user may choose to select a subcomponent type, as shown at block 1104. In embodiments, the subcomponent types for a superstructure component include bearings, hinges, field splices, longitude/transverse geometry lines, barriers, beam/frame, slab, or load types. If the user specifies one of the available subcomponent types, the user may enter metadata for the subcomponent, as shown at block 1106. The metadata may include, for instance, a name and description for the subcomponent. The subcomponent metadata is stored in the bridge information model data store at block 1108.

Figure 12:
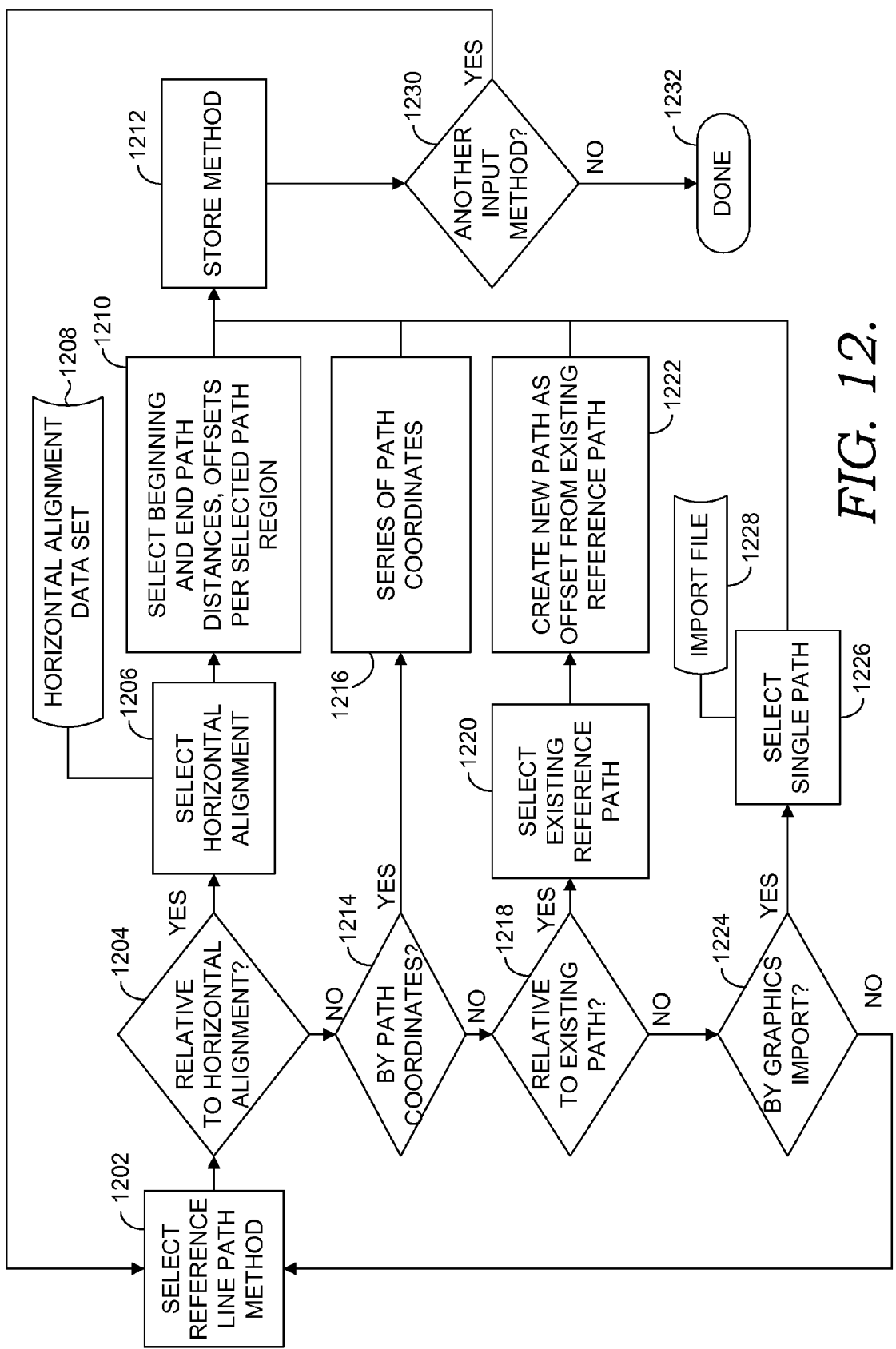
FIG. 12 is flow diagram showing a method for selecting a reference line path method in accordance with an embodiment of the present invention.

A reference line path method for the subcomponent is specified next, as shown at block 1110. The reference line path is used to describe the horizontal path for placing the superstructure subcomponent. Referring to FIG. 12, a process for selecting a reference line path method is illustrated. After the process begins at block 1202, the user may select a particular reference line path method. As shown in FIG. 12, the methods include placing the superstructure subcomponent relative to a horizontal alignment at block 1204, by path coordinates at block 1214, relative to an existing path at block 1218, and by graphics import at block 1224. If the user selects to place the subcomponent relative to a horizontal alignment, a horizontal alignment is selected from a horizontal alignment data set 1208 at block 1206. Beginning and end path distances and offsets relative to that horizontal alignment are then specified, as shown at block 1210. If the user selects to place the subcomponent by path coordinates, a series of path coordinates are entered at block 1216. Next, if the user selects to place the superstructure subcomponent relative to an existing path, an existing reference path is selected at block 1220. A new path for the subcomponent is then created as an offset from the existing reference path, as shown at block 1222. Finally, the user may select to place the subcomponent by graphics import. For instance, a superstructure subcomponent may be placed not relative to some transportation design data, but relative to some graphic line, for instance, one that's been created in a CADD file. A single path is selected from an import file 1228 (e.g., a DXF file) at block 1226.

After information has been entered specifying a reference line path method for the subcomponent, the information is stored, as shown at block 1212. It is then determined whether another reference line path method should be specified at block 1230. For instance, a subcomponent's path may use multiple reference line paths and methods to describe path segments of its horizontal path. As such, if the user selects to use another method, the process of entering information specifying a reference line path method is repeated. Otherwise, processing ends at block 1232.

Returning to FIG. 11, after selecting a reference line path method for the subcomponent, a profile path method is selected, as shown at block 1112. The profile path is used to describe the vertical path of the subcomponent. For a superstructure subcomponent, this may include defining or using referenced vertical alignments or a series of DTM surfaces to be applied to the subcomponent.

Figure 13:
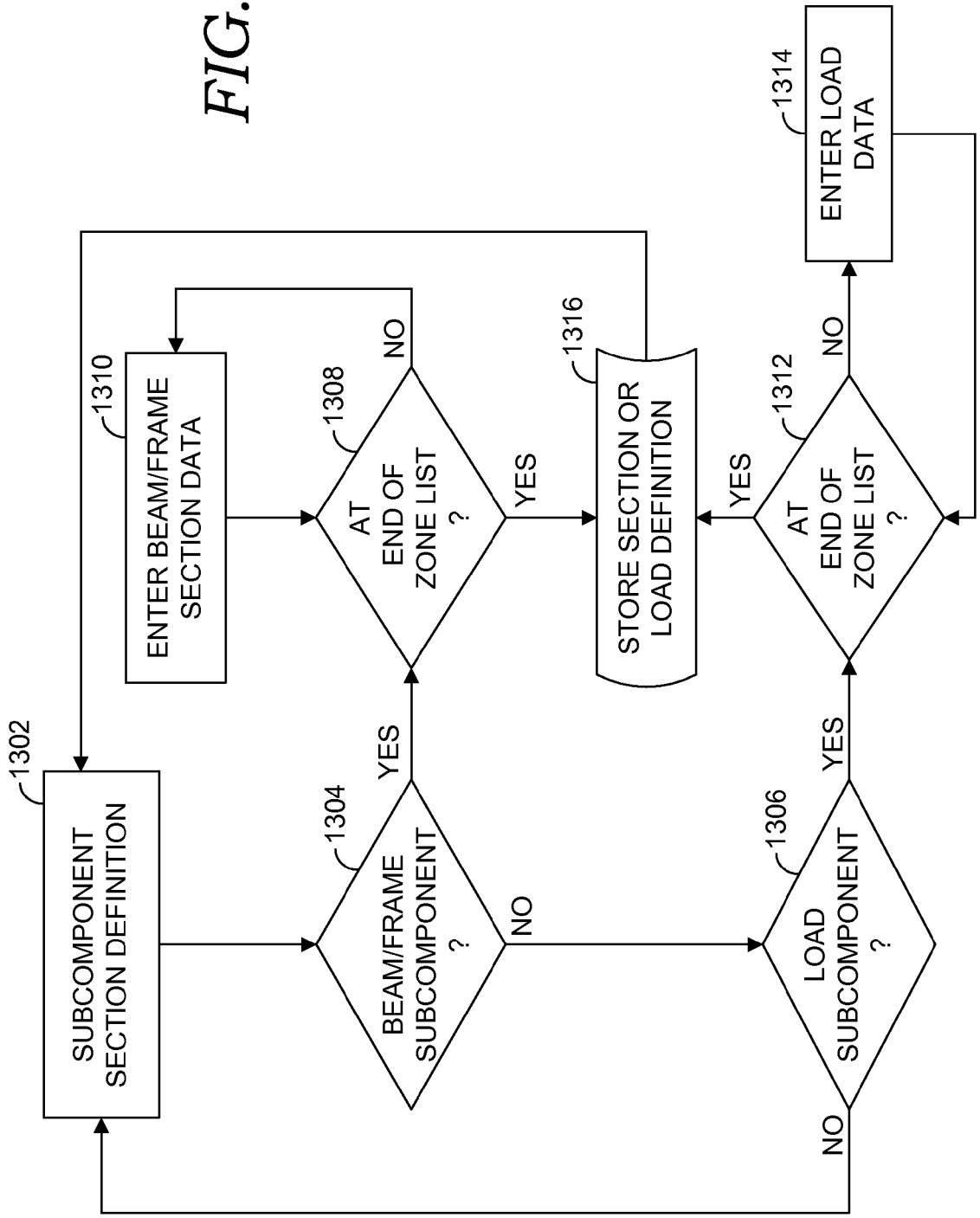
FIG. 13 is flow diagram showing a method for defining a subcomponent section in accordance with an embodiment of the present invention.

As shown at block 1114, the path and profile definition for the superstructure subcomponent are stored in the bridge information model data store. Depending on the type of superstructure component, a subcomponent section definition is provided at block 1116. For instance, section definition information may be provided for beam/frame subcomponents and load subcomponents. Accordingly, FIG. 13 provides a flow diagram of a method for defining sections of a superstructure subcomponent in accordance with an embodiment of the invention. As shown in FIG. 13, the process for defining a section definition begins at block 1302. Whether a subcomponent is a beam/frame component or a load subcomponent is determined at blocks 1304 and 1306, respectively. If the component is a beam/frame component, zones of the subcomponent are looped through and beam/frame section data is specified for each zone, as shown at blocks 1308 and 1310. The section data is stored at block 1316. If the component is a load subcomponent, zones of the subcomponent are looped through and load data for each zone is specified, as shown at blocks 1312 and 1314. The load data is then stored at block 1316.

Figure 14:
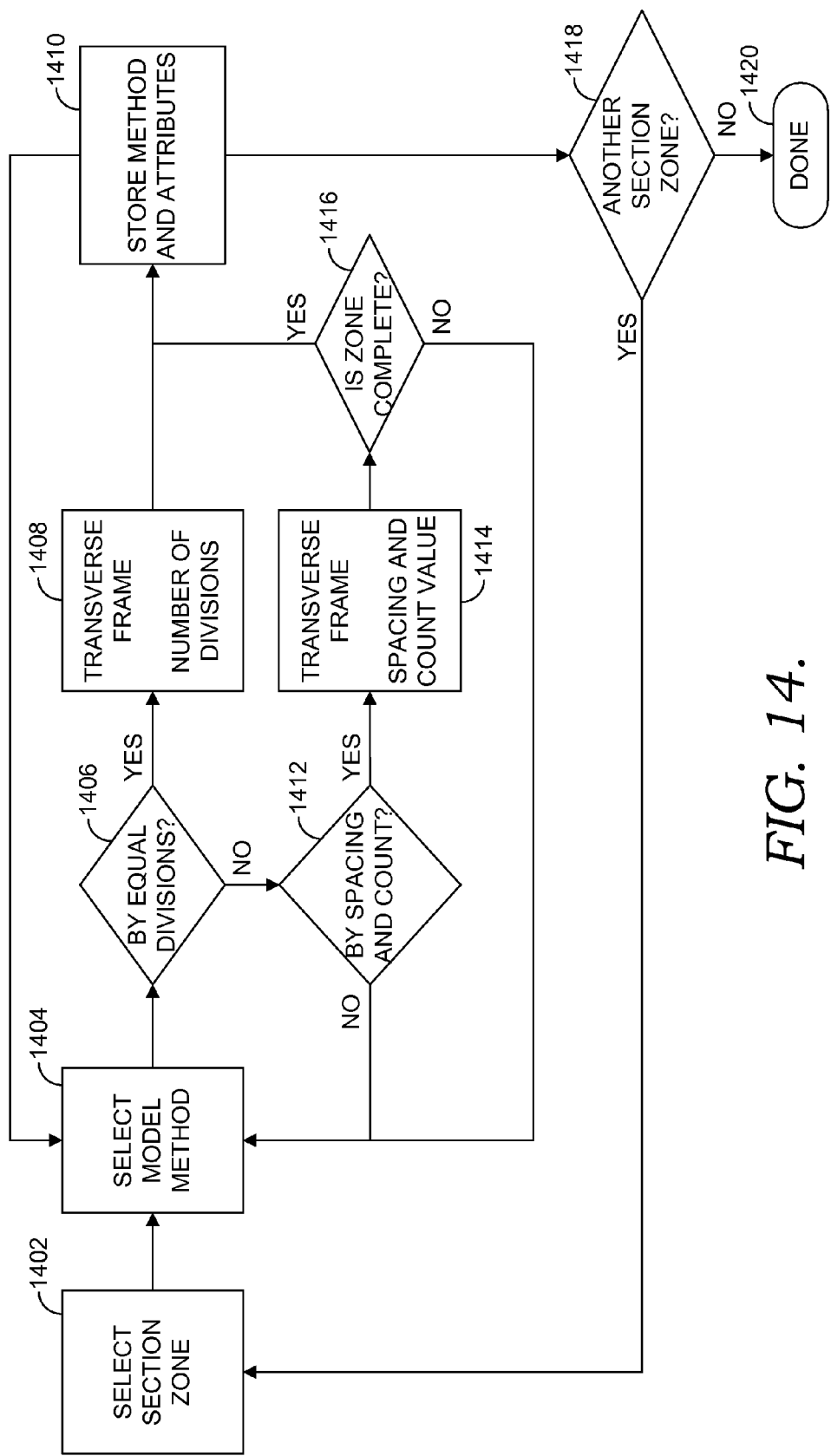
FIG. 14 is flow diagram showing a method for selecting a structural model method in accordance with an embodiment of the present invention.

Referring again to FIG. 11, structural model methods may be selected next for the superstructure subcomponent, as shown at block 1118. In particular, if sections of a superstructure subcomponent have been defined as zones along a path, transverse structural frames may be defined for each zone. Turning to FIG. 14, a flow diagram is provided showing a method for selecting structural model methods for a subcomponent. As shown at block 1402, the process begins by selecting a section zone. A structural model method is then selected at block 1404. There are two types of methods shown in FIG. 14, including by equal divisions and by spacing and count. If equal divisions is selected at block 1406, a number of divisions is specified at block 1408, such that the entire section zone is divided equally by the specified number of divisions. The selected method and attributes are then stored in the bridge information model data store, as shown at block 1410.

If spacing and count is selected at block 1412, a spacing and count is specified at block 1414 In some instances, the spacing and count may only define a portion of the section zone. Accordingly, a determination is made regarding whether the zone is complete, as shown at block 1416. If the zone is not complete, the selection process is repeated. Otherwise, the method and attributes are stored in the bridge information model data store, as shown at block 1410.

As shown at block 1418, whether there is another section zone is determined. If there is another section zone, the structural model method process is repeated for the next section zone. Once all sections zones have been completed, processing ends at block 1420.

Referring again to the flow diagram of FIG. 11, after information for the present subcomponent has been created and/or edited through the process of blocks 1102 through 1118, the superstructure subcomponent is stored in the bridge information model data store at block 1120. Another component may be then be created and/or edited at block 1132.

In some embodiments, instead of creating a superstructure subcomponent using the process from block 1102 through block 1118, a subcomponent may be imported from an external data source, such as from a SketchUp XML file. This allows the bridge information model system to handle special-case geometries that are more complex or otherwise can't be modeled using more generic approaches. The external file would include all the geometric data for establishing a three-dimensional geometric solid relative to a reference point. If this approach is chosen at block 1122, an import file 1124 is selected at block 1126. A location of the subcomponent from the import file is then specified at block 1128. Next, data from the imported file is translated to a format for storage in the bridge information model data store at block 1130.

Figure 15:
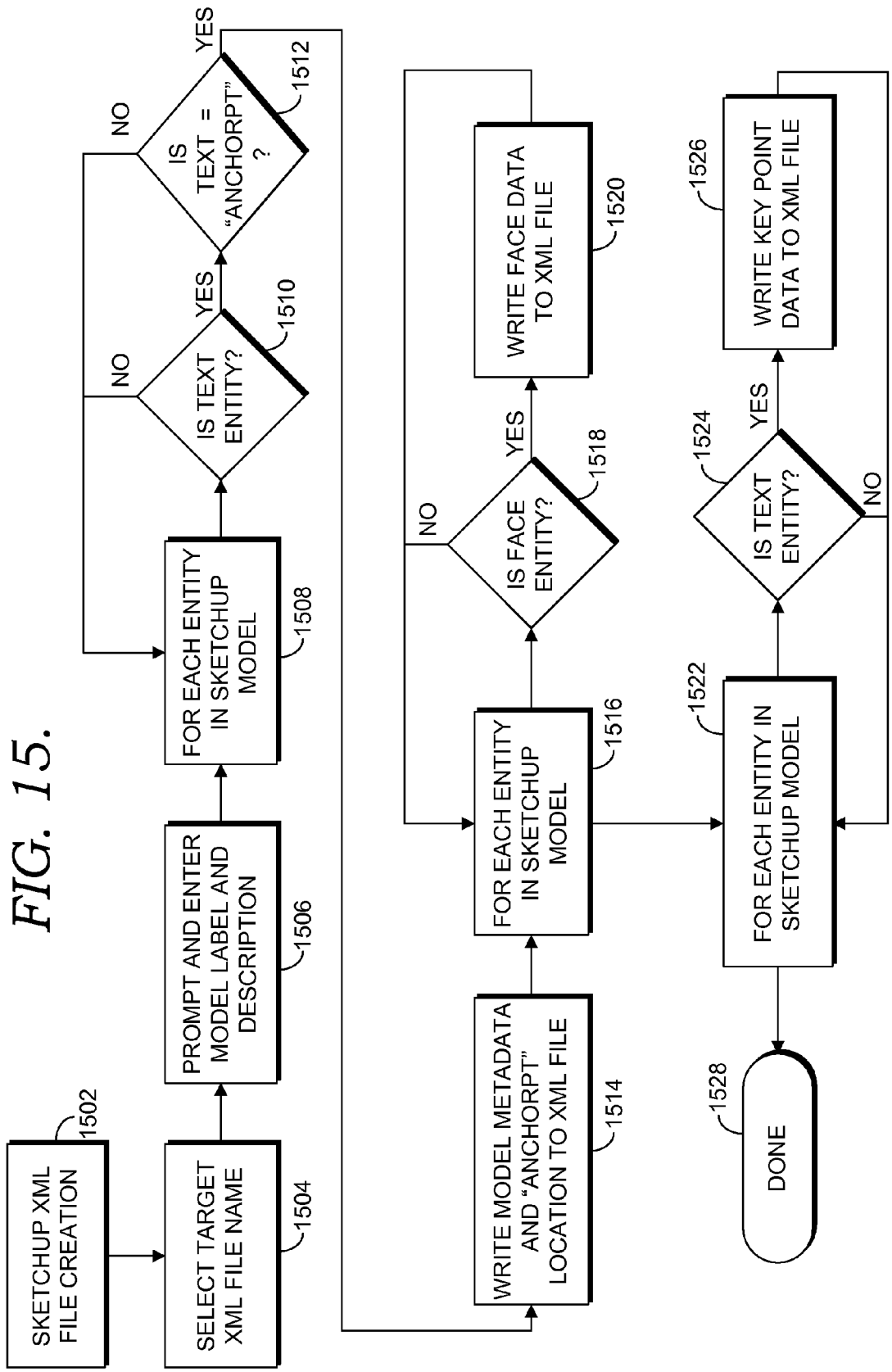
FIG. 15 is flow diagram showing a method for translating data from an imported file in accordance with an embodiment of the present invention.

By way of example only and not limitation, a process for translating data (e.g., geometric data, 3D objects, survey data points) from an imported file to a form that may be pulled into the bridge information model data store in accordance with one embodiment is shown in FIG. 15. The process described in FIG. 15 refers to the creation of an XML file from SketchUp file that may be incorporated into the bridge information model data store. However, other data files may be employed in embodiments of the present invention. As shown in FIG. 15, the process begins at block 1502. A target file name is selected at block 1504. A name and description for the file may then be provided, as shown at block 1506. Each entity in the external file being imported is analyzed to determine if it is a text entity at blocks 1508 and 1510. For each entity that is a text entity, it is determined if the text entity is labeled as an anchor point, as shown at block 1512. For text entities labeled as anchor points, the anchor point location is written to the XML file at block 1514. Each entity is also analyzed to determine if it is a face entity (e.g., the face of a 3D object) at blocks 1516 and 1518. Face data for face entities is written to the XML file at block 1520. Each entity is further analyzed at blocks 1522 and 1524 to determine entities that are text entities that may be used as key points. The key point data is then written to the XML file at block 1526. When all entities have been analyzed, process ends at block 1528.

With reference again to FIG. 11, after a subcomponent has been created and/or edited and information stored in the bridge information model data store, a determination is made regarding whether there is another subcomponent to be created and/or edited, as shown at block 1132. If the user selects to create/edit another subcomponent, the process of blocks 1104 through 1120 or from block 1122 through 1130 is repeated. Once all subcomponents have been created and/or edited, the subcomponent creation/editing process is complete, as shown at block 1134.

Returning to overall superstructure module flow diagram of FIG. 10, after creating and/or editing all subcomponents for a superstructure component, it is determined whether another superstructure component is to be created and/or edited at block 1012. If there is another superstructure component, the process of blocks 1008 and 1010 is repeated. Once all superstructure components have been created and/or edited, processing ends at block 1014.

Substructure Module

Figure 16:
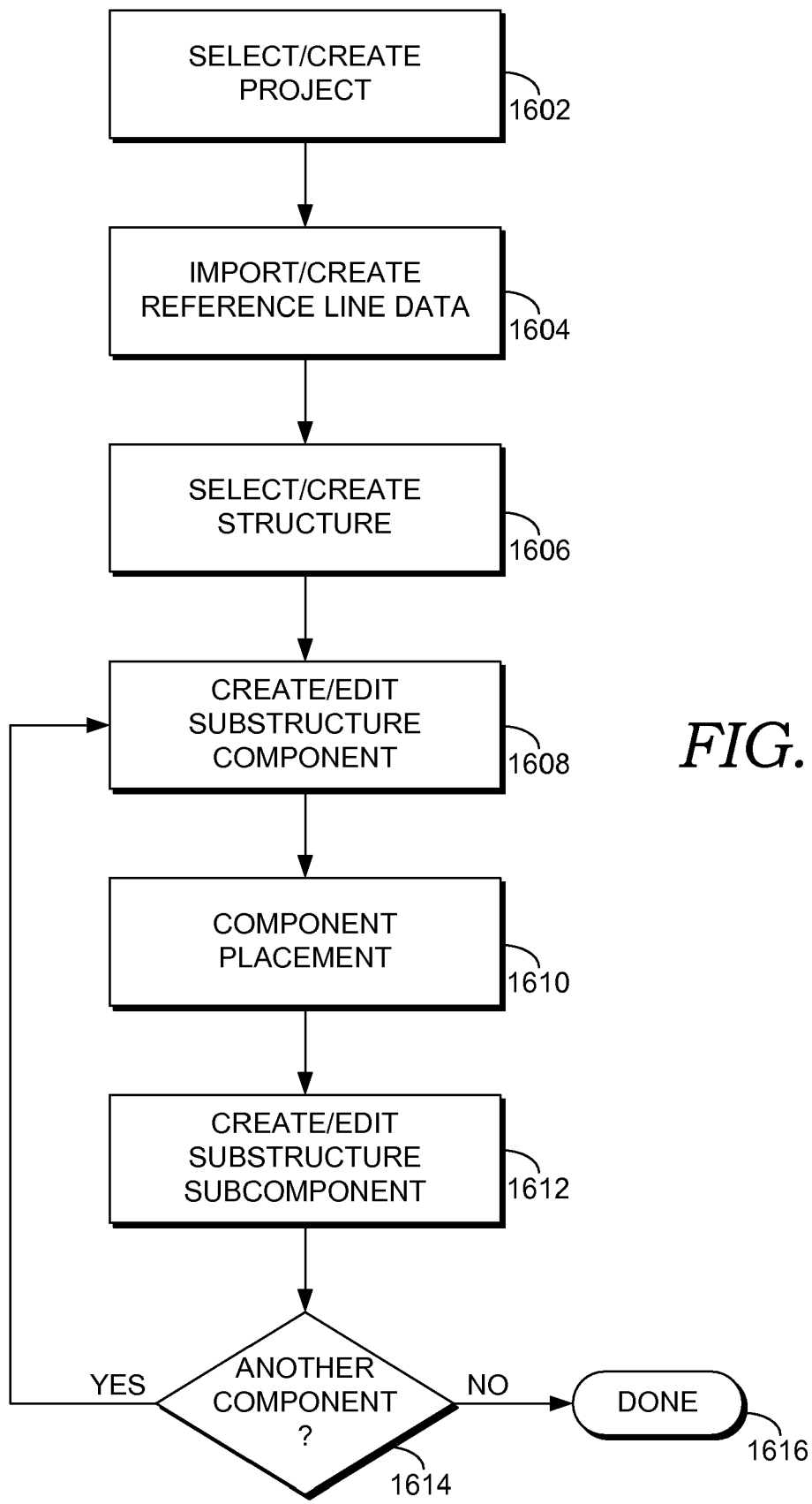
FIG. 16 is flow diagram showing a overall method for creating and/or editing a substructure component in accordance with an embodiment of the present invention.

Referring now to FIG. 16 through FIG. 19, flow diagrams are provided that illustrate methods for creating and/or editing a substructure using the substructure module in accordance with an embodiment of the present invention. With initial reference to FIG. 16, an overall process for substructure creation/editing is illustrated. As shown in FIG. 16, the process begins when a project is selected at block 1602. Alternatively, if a given project has not already been created, the user may create a new project, as described above with reference to FIG. 7. Reference line data is then imported or created, as shown at block 1604. Reference line data may be imported or created using a process similar to that described above with reference to FIG. 9. The user may then select an existing structure within the project or may create a new structure (e.g., using the process described above with reference to FIG. 8), as shown at block 1606.

Figure 17:
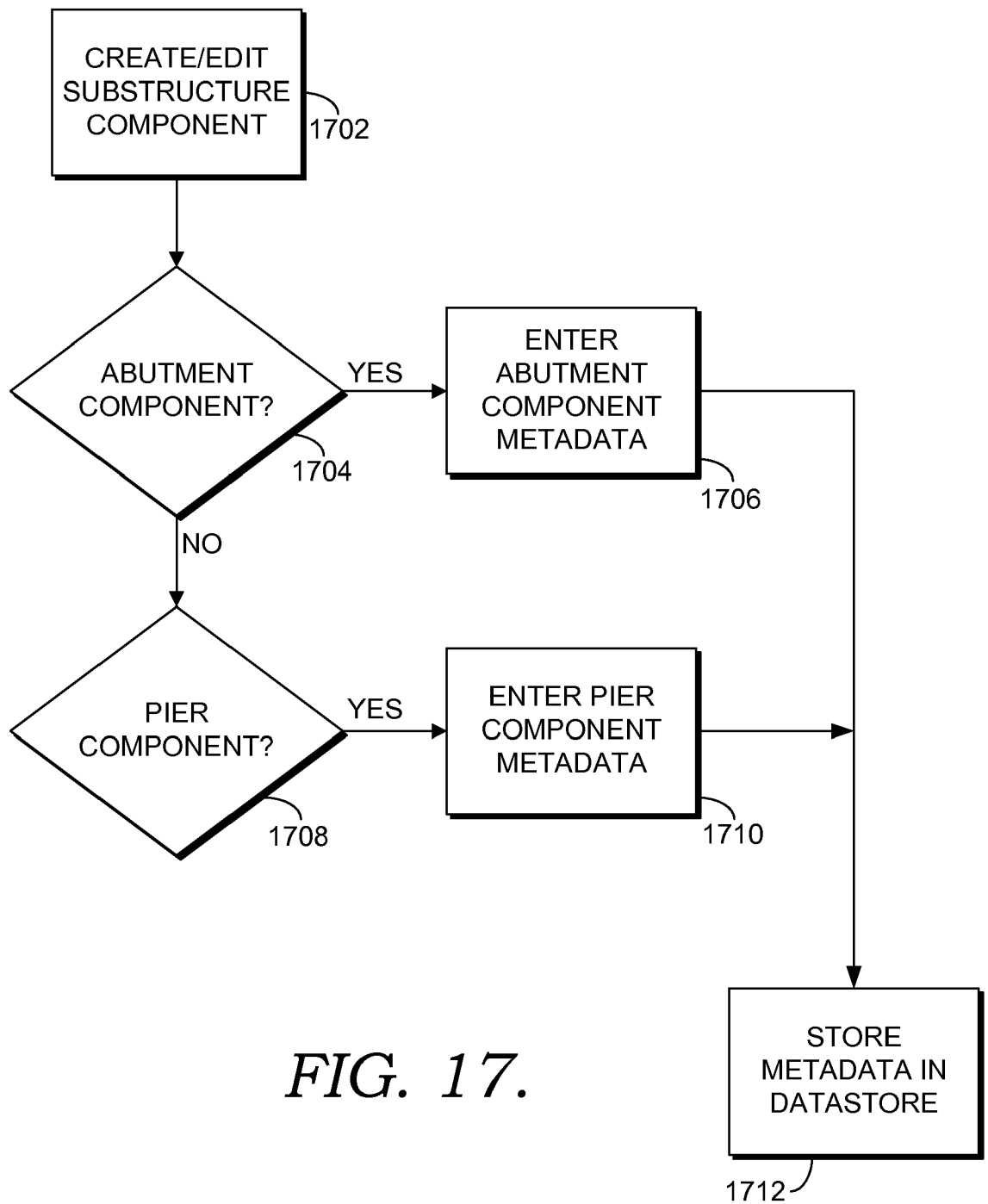
FIG. 17 is flow diagram showing a method for specifying a substructure component type and metadata in accordance with an embodiment of the present invention.

As shown at block 1608, after selecting or creating a structure, a substructure component for that structure may be created and/or edited. A process for creating and/or editing a substructure component is illustrated in FIG. 17. As shown in FIG. 17, the process may begin by a user selecting to create or edit a substructure component at block 1702. The user may then indicate that the substructure component is either an abutment component or a pier component, as shown at blocks 1704 and 1708. Abutment component metadata or pier component metadata is then entered at either block 1706 or 1710.

The metadata may include, for instance, a name and description for the substructure component. The substructure component metadata is stored in the bridge information model data store at block 1712.

Figure 18:
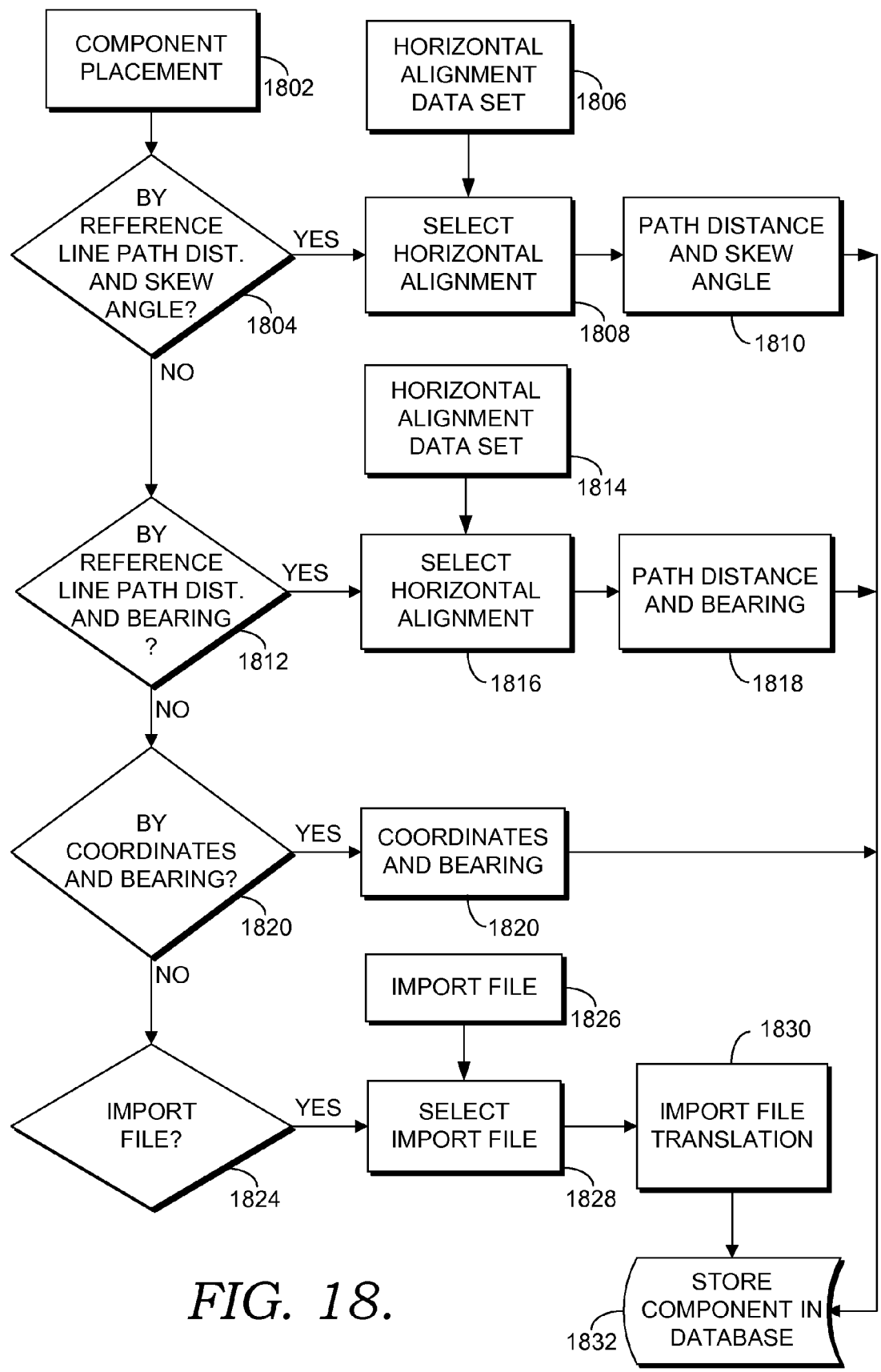
FIG. 18 is flow diagram showing a method for a substructure component placement in accordance with an embodiment of the present invention.

Returning to FIG. 16, after creating a substructure component or choosing an existing substructure to edit, the substructure component may be placed at block 1710. A flow diagram for placing the substructure component is shown at FIG. 18. Initially, as shown at block 1802, a user selects to place the substructure component. A variety of different methods may be employed for placing the substructure component. For instance, as shown at block 1804, a component placement may be by reference line, path distance, and skew angle. If the user selects this method of placement, a horizontal alignment may be selected from a horizontal alignment data set 1806, as shown at block 1808. A path distance and skew angle from selected horizontal alignment is then specified at block 1810. The component placement information is then stored in the bridge information model data store, as shown at block 1832.

Another method of component placement may be by reference line, path distance, and bearing, as shown at block 1812. This approach would be similar to the one described above, except a bearing in coordinate space would be specified instead of a skew angle. If this method of placement is selected, a horizontal alignment is selected from a horizontal alignment data set 1814, as shown at block 1816. A path distance and bearing is then specified at block 1818. The component placement information is then stored in the bridge information model data store, as shown at block 1832.

In some cases, a component placement may be specified independent of a reference line. For instance, as shown at block 1820, a component may be placed by coordinates and bearing. If this method of component placement is selected, the coordinates and bearing are specified at block 1822. The component placement information is then stored in the bridge information model data store, as shown at block 1832.

In some embodiments of the present invention, a substructure component may be imported from an external data source, such as a SketchUp XML file, for instance. This allows the bridge information model system to handle special-case geometries that are more complex or otherwise can't be modeled using more generic approaches. The file would include all the geometric data for establishing a three-dimensional geometric solid relative to a reference point. If this approach is chosen, an import file 1826 is selected at block 1828. Data from the imported file is then translated to a format for storage in the bridge information model data store at block 1830 (e.g., using the method described above with reference to FIG. 15). The imported data is then stored in the bridge information model data store, as shown at block 1832.

Figure 19:
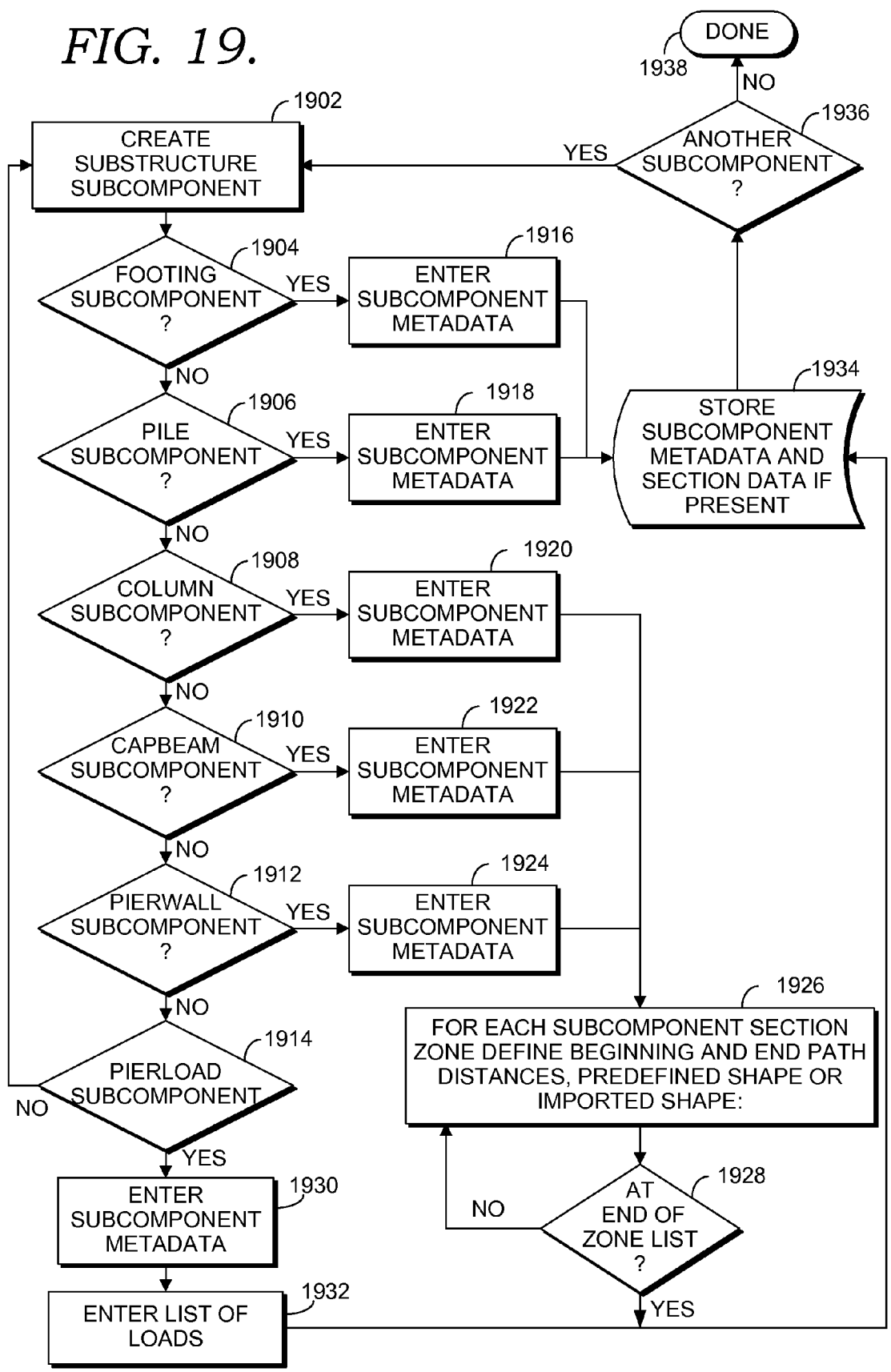
FIG. 19 is flow diagram showing a method for creating and/or editing a substructure subcomponent in accordance with an embodiment of the present invention.

Referring again to FIG. 16, after the substructure component has been placed, the user may create and/or edit substructure subcomponents, as shown at block 1612. A method for creating and/or editing a substructure subcomponent is illustrated in FIG. 19. Initially, as shown at block 1902, a user indicates to create a new substructure subcomponent or edit an existing substructure subcomponent. A type of subcomponent to create/edit is then selected, as shown at blocks 1904, 1906, 1908, 1910, 1912, and 1914. The subcomponents shown include a footing subcomponent, a pile subcomponent, a column subcomponent, a capbeam subcomponent, a pierwall subcomponent, and a pierload subcomponent. If a footing subcomponent or a pile subcomponent is selected, metadata for the subcomponent is entered at either block 1916 or 1918. The metadata may include, for instance, a name, description, placement information, width, length, thickness, links, elevation, eccentricities, and other design parameters. The subcomponent and its metadata are then stored in the bridge information model data store at block 1934.

For a column subcomponent, a capbeam subcomponent, or a pierwall subcomponent, metadata for the subcomponent is first entered at block 1920, 1922, or 1924. The metadata may include a name, description, and some design parameters for the subcomponent. However, the cross section properties of these types of subcomponents may vary along a reference line. Accordingly, at blocks 1926 and 1928, the process loops through each zone of the subcomponent and the user defines beginning and end path distances and selects a predefined shape or an imported shape for each zone. After completing each zone, the subcomponent metadata and section data is stored in the bridge information model data store at block 1934.

The pierload subcomponent is an element for connecting a substructure component to a related superstructure component. If a pierload subcomponent is selected at block 1914, metadata, such as name and description, is entered for the subcomponent at block 1930. Additionally, a list of loads for the pierload subcomponent is then entered at block 1932. The data for this may be driven by the forces that are coming from structural analysis from the superstructure module. After metadata and loads have been entered for the pierload subcomponent, the subcomponent is stored in the bridge information model data store, as shown at block 1934.

After information for a subcomponent is stored at block 1934, whether there is another subcomponent to create or edit is determined at block 1936. If there is another subcomponent, the above-described process is repeated. Otherwise, processing ends at block 1938.

With reference again to FIG. 16, after creating one or more substructure components and their components, a determination is made regarding whether there is an additional substructure component that needs to be created and/or edited at block 1614. If the user selects to create/edit another substructure component, the process of blocks 1608 through 1612 is repeated. Once all substructure components have been created and/or edited, processing is completed, as shown at block 1616.

Tunnel Module

Figure 20:
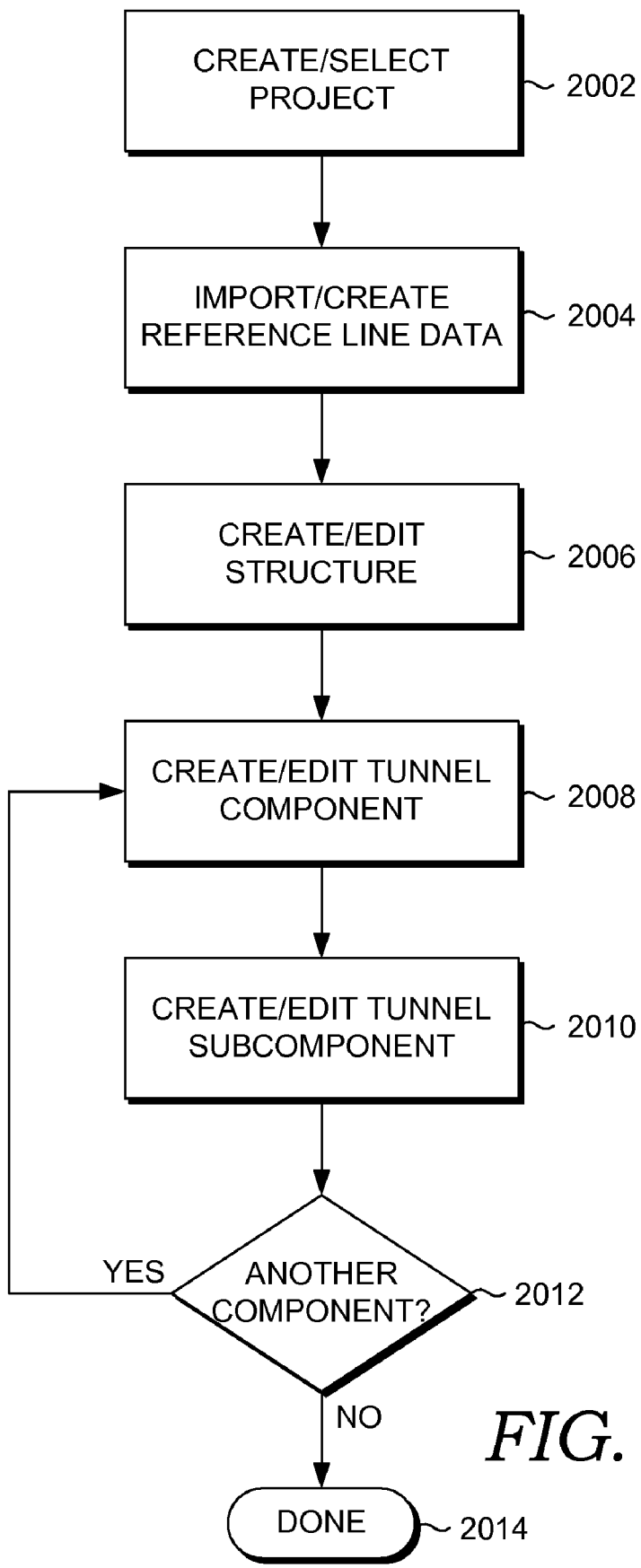
FIG. 20 is flow diagram showing an overall method for creating and/or editing a tunnel component in accordance with an embodiment of the present invention.
Figure 21:
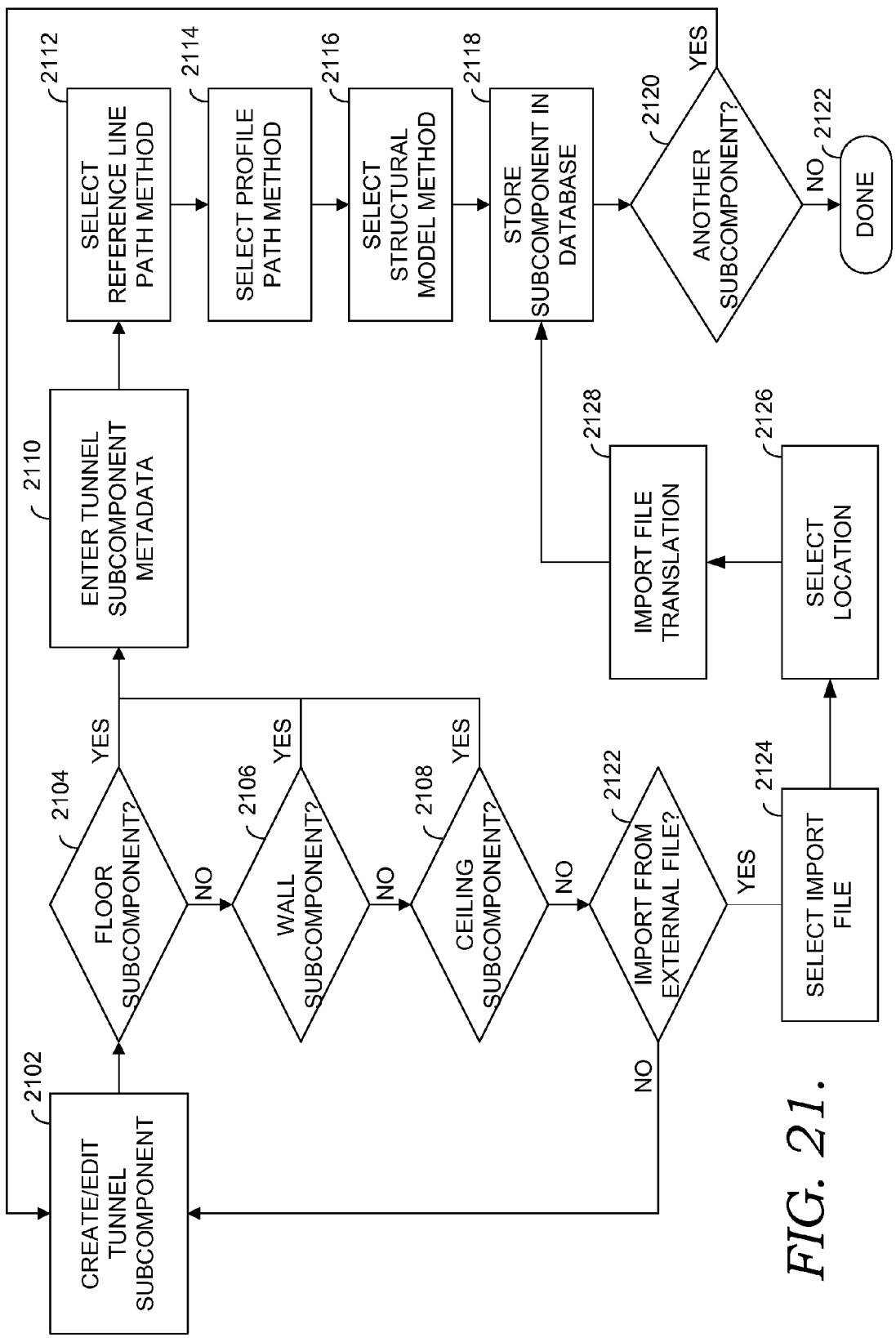
FIG. 21 is flow diagram showing a method for creating and/or editing a tunnel subcomponent in accordance with an embodiment of the present invention.
Figure 22:
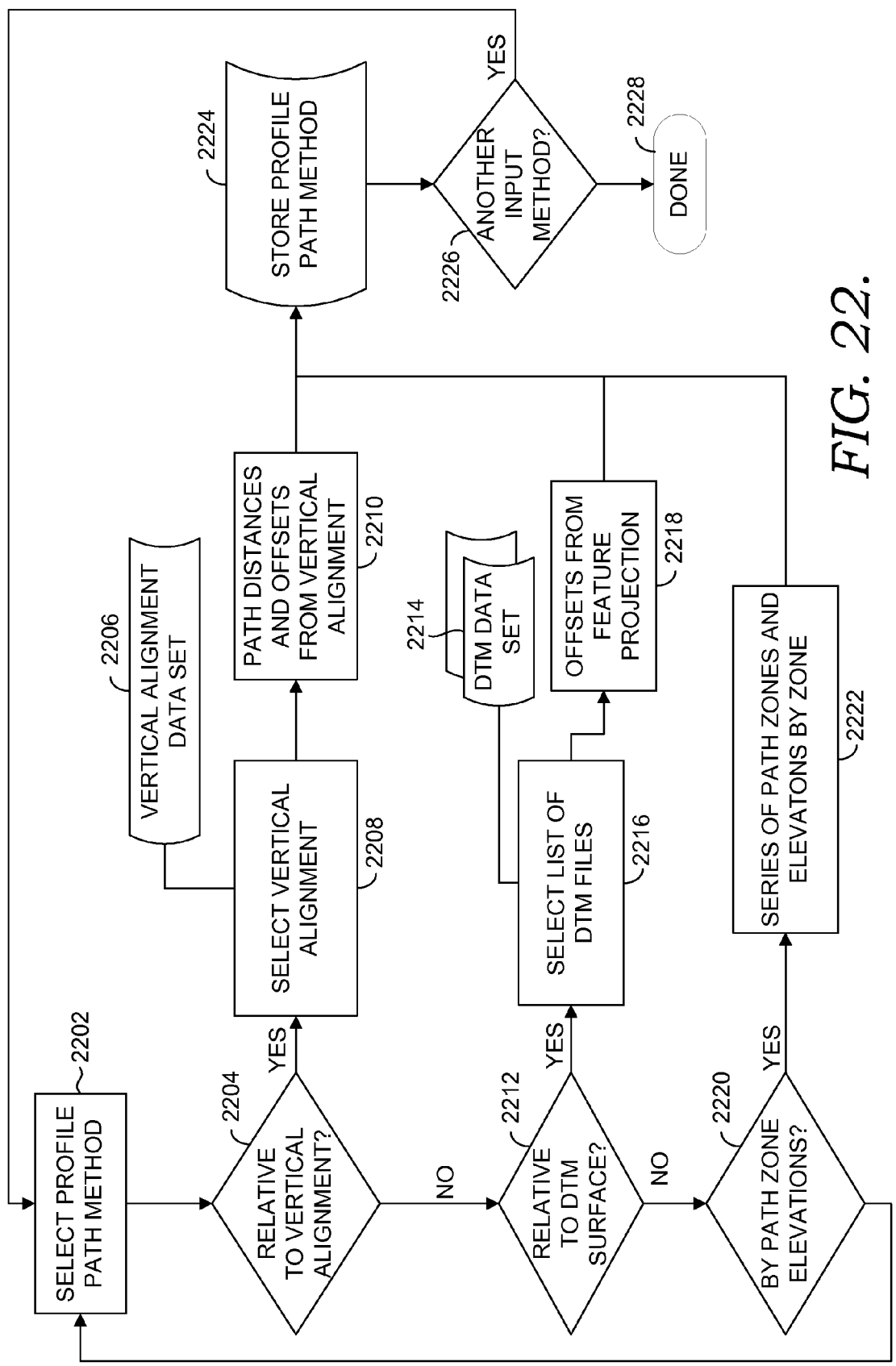
FIG. 22 is flow diagram showing a method for selecting a profile path method in accordance with an embodiment of the present invention.

Referring now to FIGS. 20 through 22, a process for creating and/or editing tunnel components for a bridge structure using the tunnel module is illustrated in accordance with an embodiment of the present invention. Initially, FIG. 20 provides an overall process for tunnel component creation/editing. As shown at block 2002, a user selects an existing project or creates a new project (e.g., using the process described above with reference to FIG. 7). Reference line data is then imported and/or created at block 2004 (e.g., using the process described above with reference to FIG. 9). As shown at block 2006, the user may then select an existing structure to edit or may create a new structure for the project (e.g., using the process described above with reference to FIG. 8).

After selecting a given bridge structure, a new tunnel component may be created for the structure or an existing tunnel component may be selected for edit, as shown at block 2008. Although not shown in FIG. 20, the process of creating/edit a tunnel component at block 2008 may include entering metadata for the tunnel component. The tunnel component metadata may include, for instance, a name and description for the tunnel component. The tunnel component and metadata are stored in the bridge information model data store.

A tunnel component may include a number of subcomponents. Accordingly, tunnel subcomponents are created and/or edited at block 2010. Turning to FIG. 21, a flow diagram is provided illustrating a method for creating/editing tunnel subcomponents in accordance with an embodiment of the present invention. After the tunnel subcomponent creation/editing process begins at block 2102, a type of tunnel subcomponent may be specified at one of blocks 2104, 2106, 2108. The tunnel subcomponents may include, for instance, a floor subcomponent, a wall subcomponent, and a ceiling subcomponent. After a given type of tunnel subcomponent is specified, metadata is entered for the subcomponent, such as a name and/or description, as shown at block 2110.

A reference line path method for the subcomponent is specified next, as shown at block 2112. The reference line path is used to describe the horizontal path for placing the tunnel subcomponent. The reference line path method may be select using a method similar to that described above with reference to FIG. 12.

After selecting a reference line path method for the tunnel subcomponent, a profile path method is selected, as shown at block 2114. The profile path is used to describe the vertical path for the tunnel subcomponent. FIG. 22 provides a process for selecting a profile path method for a tunnel subcomponent in accordance with an embodiment of the present invention. After the process begins at block 2202, the user selects a particular profile path method. As shown in FIG. 22, the profile path methods include relative to a vertical alignment, relative to a DTM surface, and by path zone elevations. If the user selects to place the tunnel subcomponent relative to a vertical alignment at block 2204, a vertical alignment is selected from a vertical alignment data set 2206 at block 2208. Additionally, path distances and offsets from the vertical alignment are specified at block 2210. If the user selects to place the tunnel subcomponent relative to a DTM surface at block 2212, a list of DTM files is selected from a DTM data set 2214, as shown at block 2216. Offsets are then specified at block 2218. Finally, if the user selects to place the tunnel subcomponent by path zone elevations at block 2220, a series of path zones and elevations by zone are specified, as shown at block 2222.

After information has been entered specifying a profile path method for the tunnel subcomponent, the information is stored, as shown at block 2224. It is then determined whether another profile path method should be specified at block 2226. For instance, a tunnel subcomponent may use multiple vertical profile paths and methods to describe its vertical path. As such, if the user selects to use another method, the process of entering information specifying a profile path method is repeated. Otherwise, processing ends at block 2228.

Referring again to FIG. 21, after defining how the tunnel subcomponent is placed in three-dimensional space including the horizontal and vertical path definitions, structural model methods may be selected for the tunnel subcomponent, as shown at block 2116. In particular, if sections of a tunnel subcomponent have been defined as zones along a path, transverse structural frames may be defined for each zone. The structural model methods may be selected according to a process such as that described above with reference to FIG. 14.

After entering metadata for the subcomponent and selecting reference line path method(s), profile path method(s) and structural model method(s) for the subcomponent, the tunnel subcomponent is stored in the bridge information model data store, as shown at block 2118.

In some embodiments, instead of creating a tunnel subcomponent using the process from block 2104 through block 2118, a tunnel subcomponent may be imported from an external data source, such as from a SketchUp XML file. This allows the bridge information model system to handle special-case geometries that are more complex or otherwise can't be modeled using more generic approaches. The file would include all the geometric data for establishing a three-dimensional geometric solid relative to a reference point. If this approach is chosen at block 2122, an import file is selected at block 2124. A location of the tunnel subcomponent from the import file is then specified at block 2126. Next, data from the imported file is translated to a format for storage in the bridge information model data store at block 2128 (e.g., using the method described above with reference to FIG. 15). The imported data is then stored in the bridge information model data store, as shown at block 2118.

After a subcomponent has been created and/or edited and information stored in the bridge information model data store, a determination is made regarding whether there is another subcomponent to be created and/or edited, as shown at block 2120. If the user selects to create/edit another subcomponent, the process of blocks 2104 through 2116 or from block 2122 through block 2128 is repeated. Once all subcomponents have been created and/or edited, the subcomponent creation/editing process is complete, as shown at block 2122.

Returning to FIG. 20, after creating and/or editing all subcomponents for a tunnel component, it is determined whether another tunnel component is to be created and/or edited at block 2012. If there is another tunnel component, the process of blocks 2008 and 2010 is repeated. Once all tunnel components have been created and/or edited, processing ends at block 2014.

Retaining Wall Module

Figure 23:
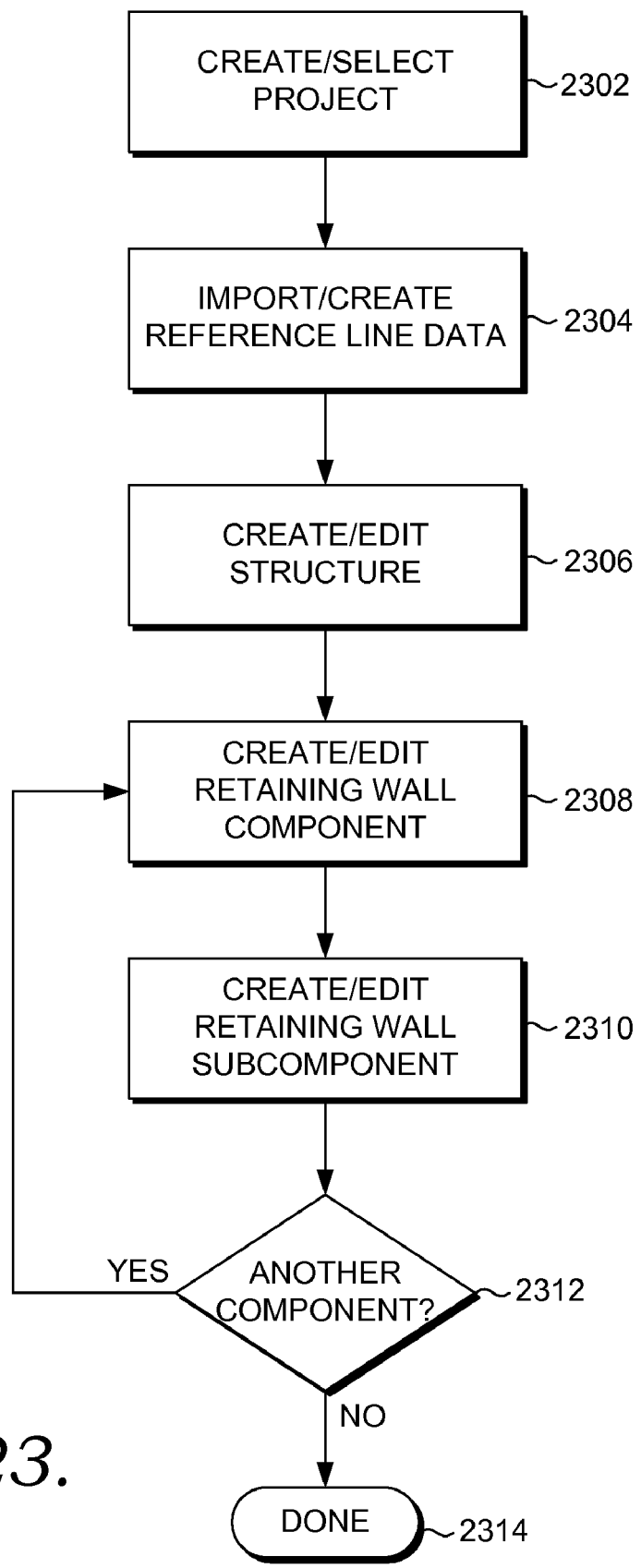
FIG. 23 is flow diagram showing an overall method for creating and/or editing a retaining wall component in accordance with an embodiment of the present invention.
Figure 24:
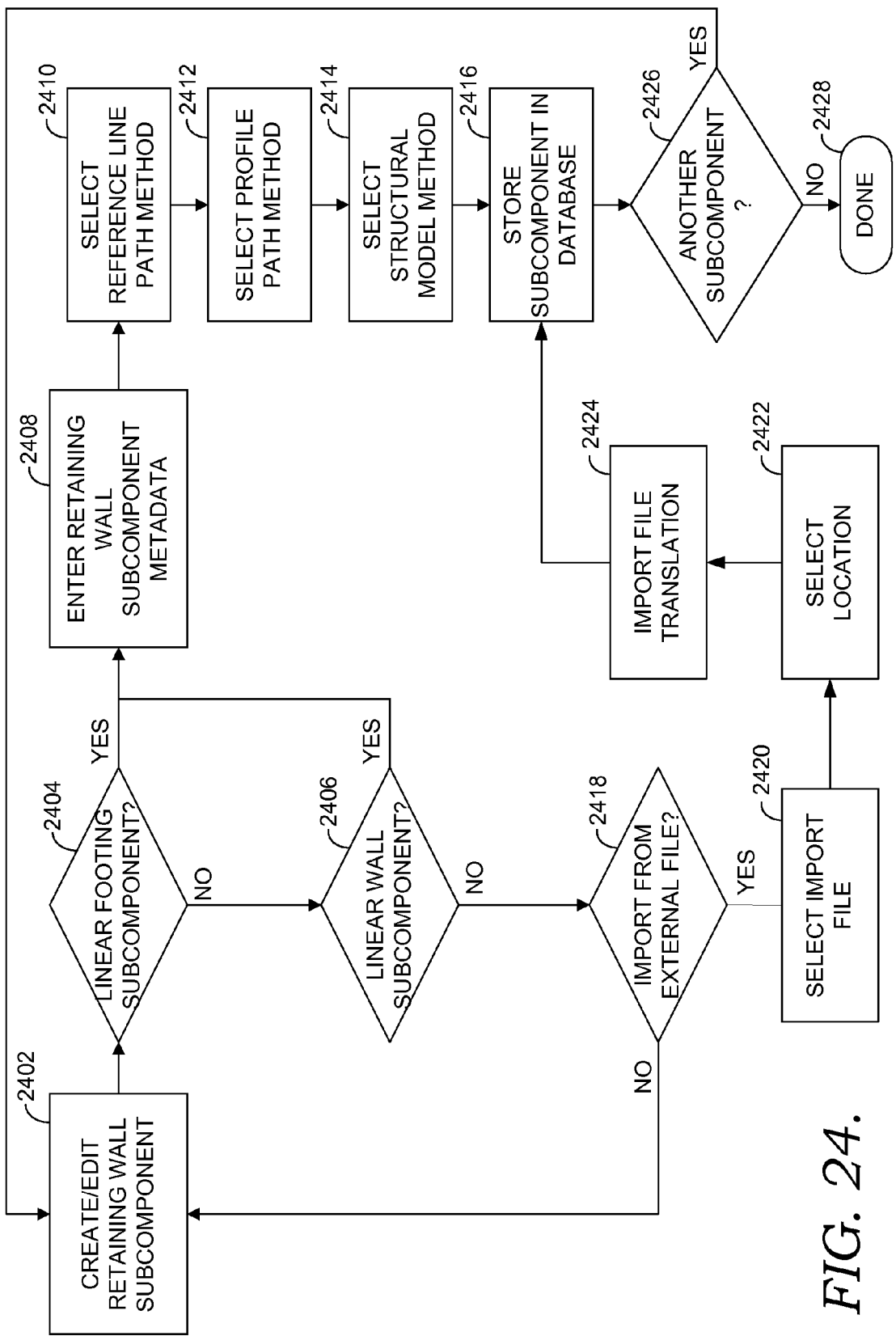
FIG. 24 is flow diagram showing a method for creating and/or editing a retaining wall subcomponent in accordance with an embodiment of the present invention.

Referring now to FIGS. 23 and 24, a process for creating and/or editing retaining wall components for a bridge structure using the retaining wall module is illustrated in accordance with an embodiment of the present invention. Initially, FIG. 23 provides an overall process for retaining wall component creation/editing. As shown at block 2302, a user selects an existing project or creates a new project (e.g., using the process described above with reference to FIG. 7). Reference line data is then imported and/or created at block 2304 (e.g., using the process described above with reference to FIG. 9). As shown at block 2306, the user may then select an existing structure to edit or may create a new structure for the project (e.g., using the process described above with reference to FIG. 8).

After selecting a given bridge structure, a new retaining wall component may be created for the structure or an existing retaining wall component may be selected for edit, as shown at block 2308. Although not shown in FIG. 23, the process of creating/edit a retaining wall component at block 2308 may include entering metadata for the retaining wall component. The retaining wall component metadata may include, for instance, a name and description for the retaining wall component. The retaining wall component and metadata are stored in the bridge information model data store.

A retaining wall component may include a number of subcomponents. Accordingly, retaining wall subcomponents are created and/or edited at block 2310. Turning to FIG. 24, a flow diagram is provided illustrating a method for creating/editing retaining wall subcomponents in accordance with an embodiment of the present invention. After the retaining wall subcomponent creation/editing process begins at block 2402, a type of retaining wall subcomponent may be specified at one of blocks 2404 and 2406. The retaining wall subcomponents may include, for instance, a linear footing subcomponent and a linear wall subcomponent. After a given type of retaining wall subcomponent is specified, metadata is entered for the subcomponent, such as a name and/or description, as shown at block 2408.

A reference line path method providing a horizontal path for the subcomponent is specified next, as shown at block 2410. The reference line path method may be specified using a process such as that described above for the tunnel module with reference to FIG. 12. Additionally, a profile path method is selected at block 2412, providing a vertical path for the subcomponent. The profile path method may be specified using a process such as that described above for the tunnel module with reference to FIG. 22. A structural model method is then selected at block 2414. The structural model method may be specified using a process similar to that described above for the tunnel module with reference to FIG. 14.

Instead of creating a linear footing or linear wall subcomponent as described above, in some cases, a subcomponent may be imported from an external data source, such as a SketchUp file. This allows the bridge information model system to handle special-case geometries that are more complex or otherwise can't be modeled using more generic approaches. The file would include all the geometric data for establishing a three-dimensional geometric solid relative to a reference point. If this approach is chosen at block 2418, an import file is selected at block 2420. A location of the retaining wall subcomponent from the import file is then specified at block 2422. Next, data from the imported file is translated to a format for storage in the bridge information model data store at block 2424 (e.g., using a process such as that described above with reference to FIG. 15). The imported data is then stored in the bridge information model data store, as shown at block 2416.

After defining a retaining wall subcomponent, the subcomponent is stored in the bridge information model data store, as shown at block 2416. A determination is then made regarding whether there is another subcomponent to be created and/or edit at block 2626. If there is another subcomponent, the subcomponent creation/editing process is repeated. Otherwise, processing ends at block 2428.

Returning to FIG. 23, after creating and/or editing all subcomponents for a retaining wall component, it is determined whether another retaining wall component is to be created and/or edited at block 2012. If there is another retaining wall component, the process of blocks 2308 and 2310 is repeated. Once all retaining wall components have been created and/or edited, processing ends at block 2314.

Structural Analysis Tools

As indicated above, the bridge information model system may employ a variety of structural analysis tools for analyzing data for a structure. Generally, this requires data that has been stored in the bridge information model data warehouse to be exported and translated to a format acceptable for the structural analysis tools.

Figure 25:
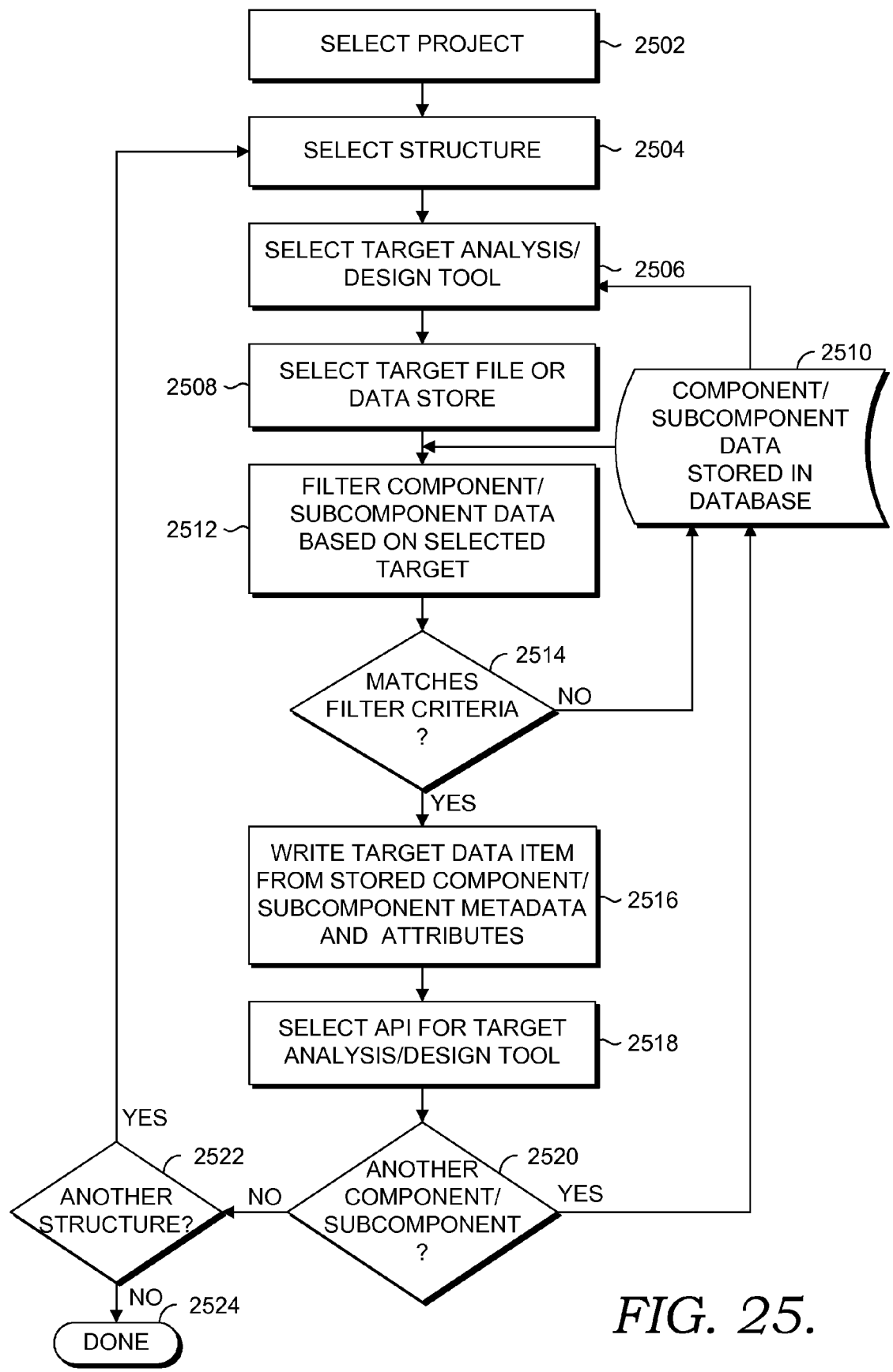
FIG. 25 is flow diagram showing a method for using a structural analysis tool with data from a bridge information model system in accordance with an embodiment of the present invention.

Referring to FIG. 25, a flow diagram is provided showing a method for using a structural analysis tool to analyze data for a structure in accordance with an embodiment of the present invention. Initially, as shown at block 2502, a user selects a project. Additionally, the user specifies a particular structure to analyze at block 2054. The user may then select a particular structural analysis tool as a target for analyzing the specified structure, as shown at block 2506. A variety of different types of analysis tools may be employed within the scope of embodiments of the present invention. By way of example only and not limitation, the target analysis tool may be a proprietary analysis tool in which data must be provided to the tool in a native format. In some instances, users may employ a database, such as a SAP2000 database for analyzing a structure. In further embodiments, analysis tools may be employed that accept data in a more generic format, such as an Excel® file or an XML file.

As shown at block 2508, a target file or data store is specified. In particular, this includes the data that will be analyzed using the structural analysis tool. Based on the specified target file or data store, data for a given component or subcomponent of a structure is retrieved from the data warehouse, as shown at block 2510. The retrieved data is then filtered based on the type of tool that is being used, as shown at block 2512. If the retrieved data does not match the filter criteria for the tool at block 2514, data for another component or subcomponent is selected and filtered. If the data matches the filter criteria, a target data item is written using stored metadata and attributes from the currently selected component or subcomponent, as shown at block 2516. An API is then selected at block 2518 for providing the data in a format for the specified tool. As shown at block 2520, the process continues by looping through the other components and/or subcomponents for the structure. For instance, if the analysis tool were being used to create and/or analyze a tunnel model, the process would cycle through each of the subcomponents stored in the bridge information model warehouse for a tunnel component of the selected structure. The process would then provide data representing a resulting tunnel model for use by the structural analysis tool.

After looping through each component and/or subcomponent for a structure, it is determined whether there is another structure to analyze at block 2522. If so, the process of block 2504 through 2520 is repeated. Otherwise, processing ends at block 2524.

Conclusion

As can be understood, embodiments of the present invention provide a bridge information model system that allows comprehensive information from various aspects of bridge design and construction to be merged together in a common information model. The bridge information model data may be leveraged by users from various perspectives, including the owner, contractor, engineer, surveyor, draftsperson, and other consumers of bridge information.

The present invention has been described in relation to particular embodiments, which are intended in all respects to be illustrative rather than restrictive. Alternative embodiments will become apparent to those of ordinary skill in the art to which the present invention pertains without departing from its scope.

From the foregoing, it will be seen that this invention is one well adapted to attain all the ends and objects set forth above, together with other advantages which are obvious and inherent to the system and method. It will be understood that certain features and subcombinations are of utility and may be employed without reference to other features and subcombinations. This is contemplated by and is within the scope of the claims.

What is claimed is:

1. A bridge information modeling system including one or more computing devices, the system comprising:
 a storage component storing bridge information as a plurality of data objects, wherein each data object represents an element of a bridge structure and includes data describing the element, wherein the data describing the element includes metadata and attributes that describe the element, wherein portions of the bridge information are associated with
 (A) a geometric model that describes the horizontal and vertical layout of structural features of a bridge, wherein a structural feature is represented as a reference line that includes types of segments, wherein the reference line controls location, placement, and dimensions of related child elements of the structural feature, wherein types of segments include tangent segments, arc segments, and spiral segments, and wherein locations in space of the structural features are based on a pre-defined vertical geometry applied to each of the segments, (B) a structural model based on the location of the different types of members and joints, (C) a survey model that includes data about key points that a surveyor would use to lay out the bridge structure, and (D) a construction model that provides a navigable 3D representation of the structure, wherein each model corresponds to a different perspective of use, and wherein the models are interrelated; and a data exchange that facilitates providing at least a portion of the bridge information in the storage component incident to receiving a request for the bridge information, wherein when the request is associated with a particular perspective of use, the portion of the bridge information that is provided includes bridge information associated with the corresponding model and interrelated data from another of the models.

2. The bridge information modeling system of claim 1, wherein the plurality of data objects are stored in a relational data structure based on hierarchical relationships among bridge structure elements represented by the data objects.

3. The bridge information modeling system of claim 2, wherein the relational data structure includes a sibling relationship between two or more data objects, wherein the two or more data objects share at least one attribute.

4. The bridge information modeling system of claim 3, wherein the two or more data objects that share the at least one attribute include at least one of the following: all data objects of a given element type for a project; all data objects of a given element type for a specified bridge structure; all data objects of a given element type for a component of a specified bridge structure; and all data objects of a given element type for a subcomponent of a specified bridge structure.

5. The bridge information modeling system of claim 1, wherein the bridge information includes geometric information, structural information, physical information, and survey information.

6. The bridge information modeling system of claim 1, wherein the particular perspective of use for the bridge information comprises at least one of the following: a geometric perspective, a structural perspective, a survey perspective, and a physical/construction perspective.

7. The bridge information modeling system of claim 1, wherein the system further comprises a superstructure module for creating and editing bridge information representing superstructure components of a bridge structure.

8. The bridge information modeling system of claim 1, wherein the system further comprises a substructure module for creating and editing bridge information representing substructure components of a bridge structure.

9. The bridge information modeling system of claim 1, wherein the system further comprises a tunnel module for creating and editing bridge information representing tunnel components of a bridge structure, wherein the tunnel components include a floor subcomponent, a wall subcomponent, and a ceiling subcomponent.

10. The bridge information modeling system of claim 1, wherein the system further comprises a retaining wall module for creating and editing bridge information representing retaining wall components of a bridge structure.

11. The bridge information modeling system of claim 1, wherein the system further comprises one or more structural analysis tools for accessing at least a portion of the bridge information from the storage components and performing structural analysis using the at least a portion of the bridge information.

12. The bridge information modeling system of claim 1, wherein the system further comprises one or more web tools facilitating access to at least a portion of the bridge information in the storage component from a remote computing device in communication with the storage component via the Internet.

13. One or more non-transitory computer-storage media comprising computer-useable instructions for performing a method comprising:

populating a data storage component with bridge information including geographic-location information, origin information, and design-specification information associated with a bridge-development project, wherein portions of the bridge information are associated with (A) a geometric model that describes the horizontal and vertical layout of structural features of a bridge, wherein a structural feature is represented as a reference line that includes types of segments, wherein the reference line controls location, placement, and dimensions of related child elements of the structural feature, wherein types of segments include tangent segments, arc segments, and spiral segments, and wherein locations in space of the structural features are based on a pre-defined vertical geometry applied to each of the segments, (B) a structural model based on the location of the different types of members and joints, wherein each type of member or joint is represented by a line segment in a mesh view, wherein the line segment is associated with attribute data that indicates the type of member or joint, and properties of the member or joint, (C) a survey model that includes data about key points that a surveyor would use to lay out the bridge structure, wherein the key points include intersection points between structural features of the bridge and bearing lines, and (D) a construction model that provides a 3D representation of the structure, wherein each model corresponds to a different perspective of use, and wherein the models are interrelated;

receiving a request to access information from the data storage component;

determining a perspective of use associated with the request;

retrieving a portion of the bridge information from the data storage component based on the perspective of use associated with the request, wherein the portion of the bridge information includes bridge information associated with the corresponding model and interrelated data from another of the models; and communicating the portion of the bridge information for presentation.

14. The media of claim 13, wherein the bridge information is stored as a plurality of data objects, wherein each of the data objects represents a bridge structure element associated with the bridge development project.

15. The media of claim 14, wherein the plurality of data objects are stored in a relational data structure based on hierarchical relationships among bridge structure elements represented by the data objects.

16. The media of claim 15, wherein the relational data structure includes a sibling relationship between two or more data objects, wherein the two or more data objects share at least one attribute.

17. One or more non-transitory computer-storage media comprising computer-useable instructions for performing a method comprising:

storing bridge information as a plurality of data objects, wherein each data object represents an element of a bridge structure and includes data describing the element, wherein the data describing the element includes metadata and attributes that describe the element;

selecting an attribute of a bridge structure element from among a list of attributes;

determining, based on whether the attribute has a unique flag set, whether the attribute is shared among a plurality of bridge structure elements having a sibling relationship, wherein when the unique flag is set the attribute is not shared, and when the unique flag is not set the attribute is shared;

when the attribute is shared, then identifying two or more data objects having a sibling relationship, wherein each of the two or more data objects represent bridge structure elements of a given type, wherein the two or more data objects share the attribute, and wherein a change made to the attribute is automatically applied to the two or more data objects that share the attribute; and when the attribute is not shared, then repeating the steps of selecting, determining, and identifying for each attribute in the list of attributes.

18. The media of claim 17, wherein the two or more data objects that share the at least one attribute include at least one of the following: all data objects of a given element type for a project; all data objects of a given element type for a specified bridge structure; all data objects of a given element type for a component of a specified bridge structure; and all data objects of a given element type for a subcomponent of a specified bridge structure.

* * * * *